US010778239B2

(12) United States Patent
Jang et al.

(10) Patent No.: US 10,778,239 B2
(45) Date of Patent: Sep. 15, 2020

(54) ELECTRONIC CIRCUIT FOR IMPLEMENTING MODULATOR CONFIGURED TO PERFORM NOISE SHAPING IN DIGITAL DOMAIN

(71) Applicant: SAMSUNG ELECTRONICS CO., LTD., Suwon-si, Gyeonggi-do (KR)

(72) Inventors: Ilhoon Jang, Hwaseong-si (KR); Seung-Tak Ryu, Daejeon (KR); Hyungjong Ko, Seongnam-si (KR); Miyoung Kim, Daejeon (KR); Seungyeob Baek, Suwon-si (KR); Min-Jae Seo, Daejeon (KR); Jaekeun Lee, Suwon-si (KR); Michael Choi, Seoul (KR)

(73) Assignees: SAMSUNG ELECTRONICS CO., LTD., Suwon-si, Gyeonggi-Do (KR); KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 0 days.

(21) Appl. No.: 16/377,460

(22) Filed: Apr. 8, 2019

(65) Prior Publication Data
US 2019/0372581 A1    Dec. 5, 2019

(30) Foreign Application Priority Data

Jun. 5, 2018   (KR) ........................ 10-2018-0064692

(51) Int. Cl.
*H03M 1/08*    (2006.01)
*H03M 3/00*    (2006.01)
*H03M 1/46*    (2006.01)

(52) U.S. Cl.
CPC ......... *H03M 1/0854* (2013.01); *H03M 1/462* (2013.01); *H03M 3/428* (2013.01)

(58) Field of Classification Search
CPC .... H03M 1/0854; H03M 3/428; H03M 1/462; H03M 3/344; H03M 3/46
(Continued)

(56) References Cited

U.S. PATENT DOCUMENTS 6,507,302 B2   1/2003   Sakimura
6,642,874 B1 *   11/2003   Lin ..................... H03M 7/3008
                                                                          341/143
(Continued)

FOREIGN PATENT DOCUMENTS

JP       2002-076902      3/2002
KR    10-2012-0006346      1/2012
(Continued)

*Primary Examiner* — Khai M Nguyen
(74) *Attorney, Agent, or Firm* — F. Chau & Associates, LLC

(57) ABSTRACT

An electronic circuit includes an analog to digital converter (ADC) and a noise coupling filter. The ADC generates a digital output signal based on a first analog signal and a second analog signal. The noise coupling filter generates the second analog signal to be fed back for an input to the ADC, based on a first quantization error signal associated with converting the first analog signal to the digital output signal. The noise coupling filter performs noise shaping on a digital error signal derived from the quantization error signal and generates the second analog signal from a result of the noise shaping, using a clock in the digital domain.

22 Claims, 13 Drawing Sheets

(58) Field of Classification Search
USPC .................................. 341/143, 155, 163, 172
See application file for complete search history.

(56) References Cited

U.S. PATENT DOCUMENTS

| | | | |
|---|---|---|---|
| 7,183,957 B1 * | 2/2007 | Melanson ............... | H03F 3/217 |
| | | | 341/143 |
| 7,825,842 B2 | 11/2010 | Rheinfelder et al. | |
| 8,102,292 B1 | 1/2012 | Van Ess | |
| 8,427,350 B2 * | 4/2013 | van Veldhoven ..... | H03M 3/368 |
| | | | 341/143 |
| 8,570,200 B2 | 10/2013 | Ashburn, Jr. et al. | |
| 8,738,474 B1 | 5/2014 | Wang | |
| 9,054,733 B2 | 6/2015 | Quiquempoix et al. | |
| 9,054,738 B2 | 6/2015 | Cho et al. | |
| 9,184,765 B1 | 11/2015 | Wang et al. | |
| 9,397,692 B1 | 7/2016 | Zanbaghl et al. | |
| 9,419,642 B1 | 8/2016 | Nguyen | |
| 9,577,662 B2 | 2/2017 | Wei et al. | |
| 9,859,914 B1 | 1/2018 | Weng et al. | |
| 9,871,534 B2 | 1/2018 | Tsai et al. | |
| 2017/0353191 A1 | 12/2017 | Weng et al. | |

FOREIGN PATENT DOCUMENTS

| | | |
|---|---|---|
| KR | 10-1136965 | 1/2012 |
| KR | 10-1783181 | 9/2017 |

\* cited by examiner

ELECTRONIC CIRCUIT FOR IMPLEMENTING MODULATOR CONFIGURED TO PERFORM NOISE SHAPING IN DIGITAL DOMAIN

CROSS-REFERENCE TO RELATED APPLICATION(S)

This application claims priority under 35 U.S.C. § 119 to Korean Patent Application No. 10-2018-0064692 filed on Jun. 5, 2018, in the Korean Intellectual Property Office, the disclosure of which is incorporated by reference herein in its entirety.

TECHNICAL FIELD

This disclosure relates generally to digital to analog (D/A) converters, and more particularly, to D/A converters with quantization noise reduction.

DISCUSSION OF THE RELATED ART

An analog to digital/digital to analog (AD/DA) modulator is a type of circuit used for analog to digital (A/D) or digital to analog (D/A) conversion. An AD/DA modulator, sometimes called a delta-sigma modulator, has known advantages of low power consumption and small size. As such, an AD/DA modulator is a good candidate for small sized portable electronic devices such as mobile phones and tablets. Further, as user demand for high performance mobile devices has risen, high resolution AD/DA modulators have been developed.

If a high-resolution AD/DA modulator is implemented through a highly complex circuit design, its size may be too large and it may consume too much power as a candidate for a target electronic device.

SUMMARY

Embodiments of the inventive concept provide a modulator including a digital noise coupling filter configured to perform noise shaping in a digital domain.

According to an example embodiment, an electronic circuit may include an analog to digital converter (ADC) and a noise coupling filter. The ADC may generate a digital output signal based on a first analog signal and a second analog signal. The noise coupling filter may generate the second analog signal to be fed back for an input to the ADC, based on a quantization error signal associated with converting the first analog signal to the digital output signal. The noise coupling filter may perform noise shaping on a digital error signal derived from the first quantization error signal and may generate the second analog signal from a result of the noise shaping, using a clock in a digital domain.

According to another example embodiment, an electronic circuit includes a noise coupling ADC, a digital filter and a nose coupling DAC. The noise coupling ADC is configured to generate a first digital error signal by A/D converting a quantization error signal associated with converting a first analog signal to a digital output signal based on a second analog signal. The digital filter is configured to generate a second digital error signal by attenuating signal components having frequencies below a reference frequency, from among signal components included in the first digital error signal. The noise coupling DAC is configured to generate the second analog signal by D/A converting the second digital error signal.

According to still another example embodiment, an electronic circuit includes an ADC and a digital filter. The ADC is configured to: generate a first digital output signal based on a first voltage formed at a reference node at a first time point; generate a first digital error signal based on a second voltage formed at the reference node at a second time point after the first time point as the first digital output signal is generated; and generate a second digital output signal based on a third voltage formed at the reference node at a third time point after the second time point as a second digital error signal is received. The digital filter is configured to provide the ADC with the second digital error signal generated by attenuating signal components having frequencies below a reference frequency, from among signal components included in the first digital error signal.

BRIEF DESCRIPTION OF THE DRAWINGS

The above and other aspects and features of the inventive concept will become apparent by describing in detail example embodiments thereof with reference to the accompanying drawings, in which like reference characters may designate like elements or operations, wherein.

DETAILED DESCRIPTION

Below, embodiments of the inventive concept may be described in detail and precision to such an extent that a person of ordinary skill in the art may readily implement the inventive concept.

Figure 1:
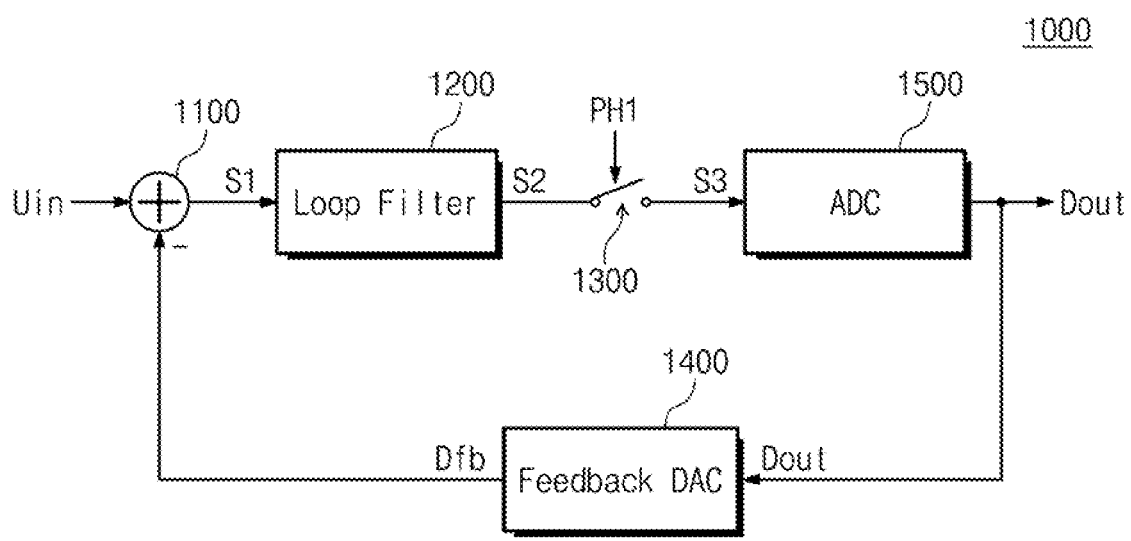
FIG. 1 is a block diagram illustrating a modulator according to an embodiment of the inventive concept.

FIG. 1 is a block diagram illustrating a modulator, 1000, according to an embodiment of the inventive concept. The modulator 1000 may function as a feedback type A/D converter to convert an input analog signal Uin to a digital output signal Dout. The modulator 1000 may include an adder 1100, a loop filter 1200, a sampler 1300, an analog to digital converter (ADC) 1500, and a feedback digital to analog converter (DAC) 1400. Since an ADC is included in a main path and a DAC is provided in a feedback path, modulator 1000 may be considered an AD/DA converter.

Modulator 1000 may also be referred to as a delta-sigma modulator. The modulator 1000 may be part of an electronic device such as a handheld mobile device, a personal computer (PC), a workstation, a notebook computer, etc. The electronic device may include various types of electronic circuits configured to process analog and digital signals.

In general, a traditional ADC outputs an n-bit pulse code modulated (PCM) code for each sampled point of an input analog signal, where each PCM code represents a quantized approximation of an absolute value of the sampled point. The quantization to a finite number of quantization levels generates quantization errors in the signal when converted back to analog, causing quantization noise which may be akin to random noise. A feedback type ADC such as modulator 1000 improves resolution and reduces quantization errors of the traditional ADC by generating and outputting codes that each represent a difference in signal level between a current sampling point of the analog signal and a previous sampling point. (Such differences may be detected in the modulator 1000 by the adder 1100.) Since these differences are usually within a smaller range than the absolute signal value range of the analog signal, resolution may be improved (and quantization noise reduced) for substantially the same number of output bits. The modulator 1000 of the inventive concept may further reduce quantization noise by configuring a main path ADC 1500 with a noise coupling filter in a feedback loop, as will be detailed below.

Hereafter, for brevity, a component partly identified with a legend and having a basic function, such as a filter, but with additional preceding descriptive words, may for brevity later be called just its functional name+its legend. For instance, a "digital noise coupling filter 3000" may subsequently be called "filter 3000".

The adder 1100 may receive the signal Uin from any other component of the electronic device or from an outside source. The adder 1100 may receive a signal Dfb, which is an analog signal, fed back from the feedback DAC 1400, and add the signal Dfb with the input signal Uin to generate a signal S1.

For example, the adder 1100 may generate the signal S1 having a level which is obtained by subtracting a level of the signal Dfb from a level of the signal Uin. (Adder 1100 effectively flips the polarity of the signal Dfb before adding the levels of Dfb with Uin. Thus, adder 1100 may alternatively be considered a "subtractor" that does not perform any polarity reversal but just subtracts the level of signal Dfb from that of signal Uin.) A signal level may be a voltage level, but the addition of currents by adder 1100 is also contemplated. The adder 1100 may output the signal S1 to the loop filter 1200. An "adder" herein may be configured with logic circuitry and may be alternatively called an adder circuit.

The loop filter 1200 may receive and filter the signal S1 from the adder 1100 and thereby generate a signal S2. To this end, the loop filter 1200 may attenuate magnitudes of signal components, which have specific frequencies, from among signal components included in the signal S1. For example, the loop filter 1200 may be a high pass filter that attenuates signal components of signal S1 at frequencies lower than a reference frequency. Alternatively, the loop filter 1200 may be a bandpass filter. The loop filter 1200 may output the signal S2 to the sampler 1300. Note that the loop filter 1200 may include an amplifier or the like to also function as an integrator in some embodiments.

Figure 4:
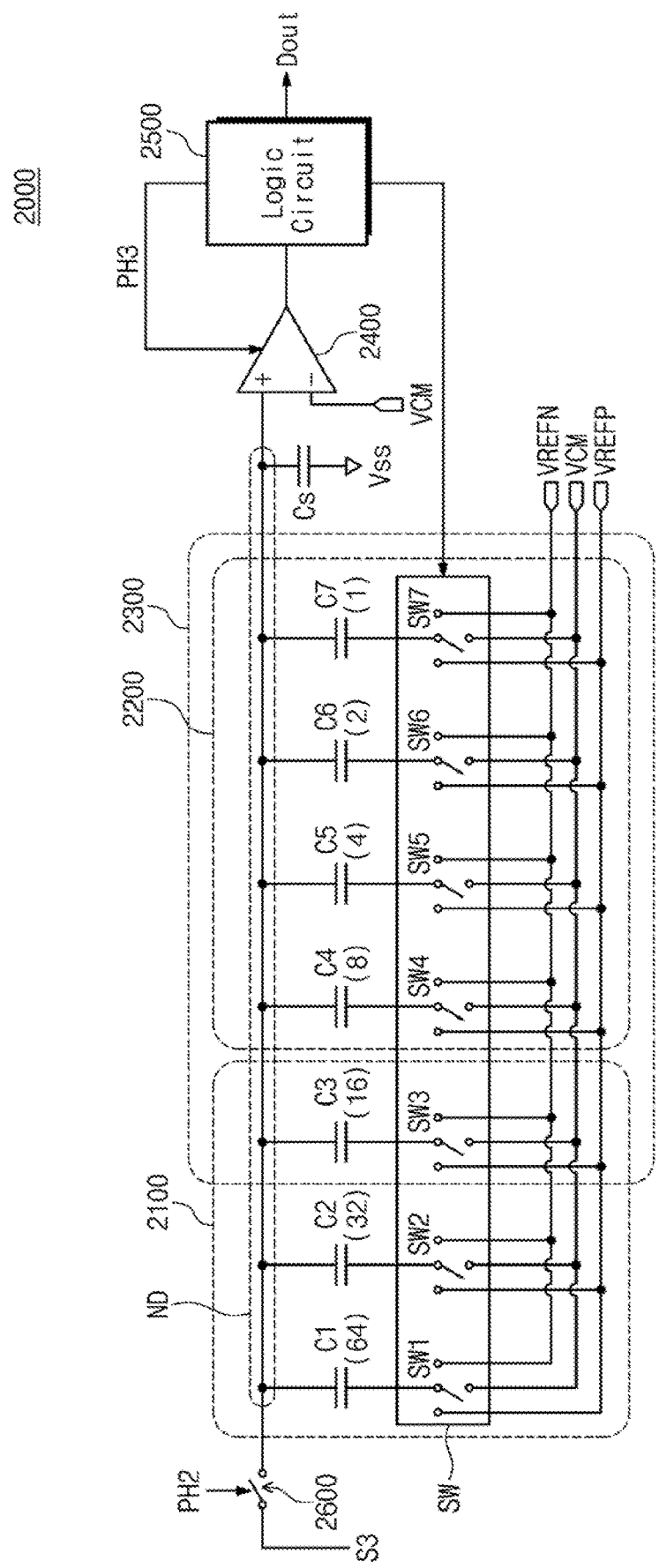
FIG. 4 is a circuit diagram illustrating an example configuration for implementing a main ADC of FIG. 2, a noise coupling ADC of FIG. 3, and a noise coupling DAC of FIG. 3.

The sampler 1300 may receive the signal S2 from the loop filter 1200 and also receive an operating signal PH1 from a logic circuit included in the ADC 1500 (e.g., logic circuit 2500 shown in FIG. 4). The sampler 1300 may sample the signal S2 based on a frequency "fs" of the operating signal PH1, and thereby generate a signal S3 which may be a discontinuous analog signal (a "sample and hold" signal).

The sampler 1300 of FIG. 1 is illustrated in the form of a switch element, and this is provided for better understanding. Sampler 1300 may be implemented with hardware circuits (e.g., a capacitor and a flip-flop) configured to sample and hold an intended signal level. The sampler 1300 may output the signal S3 to the ADC 1500, which receives the signal and converts it to a digital signal Dout.

For example, the ADC 1500 may include electronic circuits configured with noise coupling-based topology. The ADC 1500 may output the signal Dout to the exterior of the modulator 1000. For example, the ADC 1500 may output the signal Dout to any other component of an electronic device including a modulator, or to an external electronic device, and the signal Dout may be used to operate the electronic device. The ADC 1500 may also feed back the signal Dout to the feedback DAC 1400. Example configurations and operations of the ADC 1500 will be more fully described with reference to FIGS. 2 to 14.

The feedback DAC 1400 may receive the signal Dout from the ADC 1500 and convert the signal Dout to the analog signal Dfb. The feedback DAC 1400 may feed the signal Dfb back to the adder 1100.

Since a level of the signal Dfb fed back from the feedback DAC 1400 is subtracted from a level of the signal Uin by the adder 1100, the signal S1 may be generated which has a level equaling a difference value between the level of the signal Dfb and the level of the signal Uin. The signal S1, which is generated based on the signal Dfb, may be converted to the signal Dout through the loop filter 1200, the sampler 1300, and the ADC 1500.

As the signal Dfb converted from the signal Dout through the feedback DAC 1400 is continuously fed back, a difference between the level of the signal Uin and a value of data of the signal Dout may be continuously converted to the signal Dout. Further, a difference between the level of the signal Uin and the value of the data of the signal Dout may converge towards "0". Accordingly, the data of the signal Dout may closely approximate the level of the signal Uin through a feedback path formed by the feedback DAC 1400.

Figure 2:
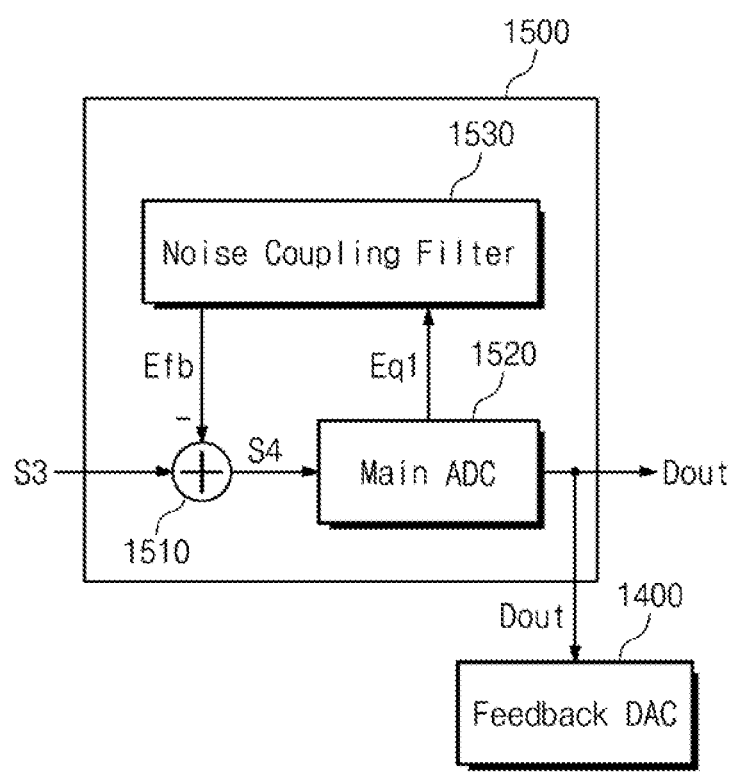
FIG. 2 is a block diagram illustrating an example configuration of an ADC of FIG. 1.

FIG. 2 is a block diagram illustrating an example configuration of an ADC of FIG. 1. In this example, the ADC 1500 may include an adder 1510, a main ADC 1520, and a noise coupling filter 1530.

The adder 1510 may receive the signal S3 sampled by the sampler 1300 of FIG. 1, and also receive a signal Efb from the noise coupling filter 1530. The adder 1510 may add the receive signal S3 and the signal Efb to output a signal S4. For example, the adder 1510 may generate the signal S4 having a level which is obtained by subtracting a level of the signal Efb from a level of the signal S3. (Similar to adder 1100, the adder 1510 may effectively flip the polarity of the signal Efb before adding the levels of the signals Efb and S3. Thus, adder 1500 may alternatively be considered a subtractor that does not perform any polarity reversal but just subtracts the level of signal Efb from that of signal S3.) The adder 1510 may output the signal S4 to the main ADC 1520. For example, the adder 1510 may provide a node at which received signals are added, rather than performing an active operation for adding the received signals (see, e.g., FIG. 4).

The main ADC 1520 may receive the signal S4 from the adder 1510 and convert the signal S4 (which is analog) to generate the digital signal Dout. The main ADC 1520 may output the signal Dout to the exterior of the modulator 1000 based on a clock. The main ADC 1520 may also feed back the signal Dout to the feedback DAC 1400 based on the clock. For example, the main ADC 1520 may include a logic circuit for generating the clock.

A quantization error may occur when the signal S4 is A/D converted by the main ADC 1520. In the present disclosure, the quantization error, which is an error occurring upon converting an analog signal to a digital signal, may be associated with a difference between a level of an analog signal before conversion and a data value of a digital signal after conversion. Herein, a quantization error may be represented by a physical quantity such as a voltage or a current. As such, a quantization error herein may be referred to interchangeably as a quantization error signal, a quantization error level, or the like. A quantization error signal varies with time and thereby contains a range of frequency components, which may be filtered to attenuate frequencies outside a desired range.

For example, a level of a signal Eq1 (also referred to herein interchangeably as a quantization error signal) may express the magnitude of the quantization error occurring upon converting the signal S4 to the signal Dout. The magnitude of the quantization error expressed by the signal Eq1 may be associated with a difference between a level of the signal S4 and a data value of the signal Dout. For noise shaping, the main ADC 1520 may output the signal Eq1 expressing the quantization error to the noise coupling filter 1530.

The noise coupling filter 1530 may receive the signal Eq1 from the main ADC 1520 and filter the signal Eq1 to perform the noise shaping on the quantization error occurring in the main ADC 1520. For example, the noise coupling filter 1530 may attenuate magnitudes of signal components, which have specific frequencies, from among signal components included in the signal Eq1.

For example, the noise coupling filter 1530 may have a configuration of a high pass filter for the purpose of performing the noise shaping. Alternatively, the noise coupling filter 1530 may be a bandpass filter. In either case, the noise coupling filter 1530 may attenuate magnitudes of signal components, the frequencies of which are lower than a reference frequency, from among the signal components included in the signal Eq1. The noise coupling filter 1530 may filter the signal Eq1 based on the clock and may generate the signal Efb. The noise coupling filter 1530 may output the signal Efb to the adder 1510 based on the clock. For example, the noise coupling filter 1530 may receive the clock from the main ADC 1520.

For example, the noise coupling filter 1530 may have a characteristic of a transfer function H1(z) (an example first order high pass filter) corresponding to Equation 1.

$$H1(z)=(1-z^{-1})^n \qquad \text{[Equation 1]}$$

In the present disclosure, "z" represents a complex frequency according to z-transform, and "n" is a natural number. Note, however, that other transfer functions may be substituted for that of Equation 1 in alternative examples.

Generally, a noise coupling filter may include a filter operating in an analog domain to perform noise shaping in a DA/AD converter. Components of high complexity, such as a plurality of active elements (e.g., an amplifier) may be typically provided to design a filter having the transfer function of Equation 1 (e.g., a transfer function of an n-th order high pass filter) and operate in the analog domain. Accordingly, such a noise coupling filter which operates in the analog domain may occupy a large area and may consume considerable power.

In contrast, in embodiments of the inventive concept, the noise coupling filter 1530 may include a filter operating in the digital domain to perform noise shaping.

Accordingly, the ADC 1500 of FIG. 2 may be considered an electronic circuit that includes: (i) an ADC (1520) configured to generate a digital output signal (Dout) based on a first analog signal (S3) and a second analog signal (Efb); and (ii) a noise coupling filter (1530) configured to generate the second analog signal (Efb), which is fed back to an input portion of the ADC (the adder 1510), based on a quantization error signal (Eq1) associated with converting the first analog signal (S3) to the digital output signal (Dout). Moreover, the noise coupling filter (1530) may be further configured to perform noise shaping on a digital error signal (e.g. signal Ed1 of FIG. 3, discussed below) derived from the quantization error signal and to generate the second analog signal (Efb) from a result of the noise shaping, using a clock (CLK) in a digital domain.

An example configuration and example operations of the noise coupling filter 1530 including a filter operating in the digital domain will be more fully described with reference to FIG. 3.

Figure 3:
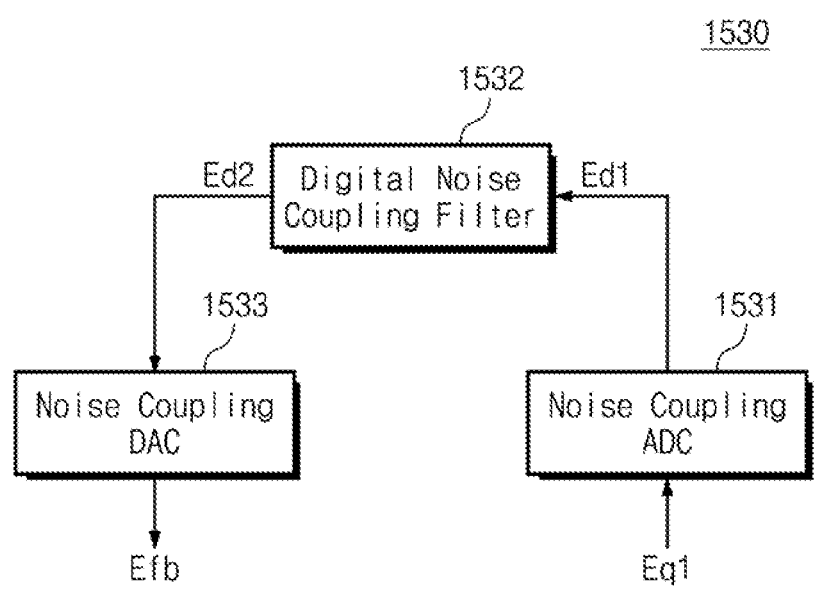
FIG. 3 is a block diagram illustrating an example configuration of a noise coupling filter of FIG. 2.

FIG. 3 is a block diagram illustrating an example configuration of a noise coupling filter of FIG. 2. In this example, the noise coupling filter 1530 may include a noise coupling ADC 1531, a digital noise coupling filter 1532, and a noise coupling DAC 1533.

The noise coupling ADC 1531 may receive the signal Eq1 expressing a quantization error from the main ADC 1520. As described with reference to FIG. 2, the signal Eq1 may be an analog signal expressing a quantization error associated with a difference between a level of the signal S4 and a data value of the signal Dout.

The noise coupling ADC 1531 may convert a received analog signal into a digital signal. In the example of FIG. 3, the noise coupling ADC 1531 may convert the signal Eq1 to generate a digital signal Ed1. Accordingly, the digital signal Ed1 may indicate data associated with the magnitude of the quantization error. The noise coupling ADC 1531 may output the digital signal Ed1 to the digital noise coupling filter 1532 based on a clock CLK. For example, the clock CLK may be received from a logic circuit included in the main ADC 1520 (e.g., logic circuit 2500 of FIG. 4).

The digital noise coupling filter 1532 may receive the digital signal Ed1 from the noise coupling ADC 1531, and filter the digital signal Ed1. For example, the digital noise coupling filter 1532 may attenuate magnitudes of signal components, which have specific frequencies, from among signal components included in the digital signal Ed1. For example, the digital noise coupling filter 1532 may have a characteristic of a high pass filter and may thereby attenuate magnitudes of signal components having frequencies lower than a reference frequency from among the signal components included in the digital signal Ed1.

The digital noise coupling filter 1532 may filter the digital signal Ed1 based on the clock CLK and may generate a digital signal Ed2. The digital noise coupling filter 1532 may output the digital signal Ed2 to the noise coupling DAC 1533. For example, the clock CLK may be received from the logic circuit included in the main ADC 1520.

In the present disclosure, the digital noise coupling filter 1532 having characteristics of second-order and third-order high pass filters will be described. However, in other examples, the digital noise coupling filter 1532 may be variously changed or modified to have a characteristic of an m-th order high pass filter ("m" being a natural number other than two or three in these alternative examples).

For example, the digital noise coupling filter 1532 may have a characteristic of a transfer function H2(z) corresponding to Equation 2.

$$H2(z)=2z^{-1}-z^{-2} \quad \text{[Equation 2]}$$

Referring to Equation 2, the transfer function H2(z) may have a characteristic of the second-order high pass filter. An example configuration of the digital noise coupling filter 1532 including a configuration of the second-order high pass filter will be described later with reference to FIG. 11.

For example, the digital noise coupling filter 1532 may have a characteristic of a transfer function H3(z) corresponding to Equation 3.

$$H3(z)=3z^{-1}-3z^{-2}+z^{-3} \quad \text{[Equation 3]}$$

Referring to Equation 3, the transfer function H3(z) may have a characteristic of the third-order high pass filter.

The digital noise coupling filter 1532 may be implemented with a small number of elements than an analog filter counterpart because it processes digital signals in the digital domain. Also, the digital noise coupling filter 1532 may have a low complexity design (see, e.g., FIG. 11). Accordingly, the noise coupling filter 1530 including the digital noise coupling filter 1532 may occupy a smaller area, and consume less power than one with a filter operating in the analog domain. The modulator 1000 implemented by using the digital noise coupling filter 1532 may have a characteristic of a high-order transfer function, but may occupy a smaller area and consume less power.

The noise coupling DAC 1533 may receive the digital signal Ed2 from the digital noise coupling filter 1532. The noise coupling DAC 1533 may convert a received digital signal, e.g., signal Ed2, into an analog signal, e.g., signal Efb. The noise coupling filter 1533 may output the signal Efb to the adder 1510 of FIG. 2 based on the clock CLK. For example, the clock CLK may be received from the logic circuit included in the main ADC 1520.

Since the signal Efb is generated based on the signal Eq1 expressing the quantization error, the signal Efb may be associated with the quantization error. For example, a level of the signal Efb may be associated with the magnitude of the quantization error noise-shaped by the digital noise coupling filter 1532. Accordingly, the magnitude of the quantization error which is expressed by the signal S4 obtained by subtracting a level of the signal Efb from a level of the signal S3 may be smaller than the magnitude of the quantization error expressed by the signal S3. Accordingly, as the signal Efb converted from the signal Eq1 is fed back through a path formed by the noise coupling filter 1530, the signal Dout indicating data more closely resembling the level of the signal S4 may be generated.

FIG. 4 is a circuit diagram illustrating an example configuration for implementing a main ADC of FIG. 2, a noise coupling ADC of FIG. 3, and a noise coupling DAC of FIG. 3.

Referring to FIG. 4, the main ADC 1520 of FIG. 2, the noise coupling ADC 1531 of FIG. 3, the noise coupling DAC 1533 of FIG. 3, and the adder 1510 of FIG. 2 may be implemented with a successive approximation register (SAR) ADC 2000. However, it should be noted that in other embodiments, a SAR ADC having other configurations, such as including a differential input structure, may be adopted.

The SAR ADC 2000 may include a main ADC block 2100 (an example of main ADC 1520), a noise coupling ADC block 2200 (an example of noise coupling ADC 1531), a noise coupling DAC block 2300 (an example of noise coupling DAC 1533), a comparator 2400, a logic circuit 2500, a sampler 2600, and a capacitor Cs. (Herein, a "block" may be circuitry that is a portion of a larger circuit.) The SAR ADC 2000 may further include a switch block SW with switches SW1 to SW7. The switches SW1 to SW3, which belong to a first group from among switches SW1 to SW7 of the switch block SW, may operate as components of the main ADC block 2100. The switches SW4 to SW7, which belong to a second group from among the switches SW1 to SW7 of the switch block SW, may operate as components of the noise coupling ADC block 2200. The switches SW3 to SW7, which belong to a third group from among the switches SW1 to SW7 of the switch block SW, may operate as components of the noise coupling DAC block 2300.

The switches SW1 to SW7 may respectively connect one of a terminal with a voltage VREFP, a terminal with a voltage VREFN, and a terminal with a voltage VCM, with capacitors C1 to C7 under control of the logic circuit 2500, which may output a control signal CTRL to the switches SW1 to SW7 to control the same. For example, the voltage VREFP may correspond to a logic value of "1", the voltage VREFN may correspond to a logic value of "0", and the voltage VCM may correspond to a common mode voltage which does not provide a logic value.

The switches SW1 to SW7 may respectively correspond to individual bits of data to be output as the signal Dout. For example, the switches SW1 to SW3 in the first group may sequentially correspond to data converted from the signal S4 input to the main ADC 1520, from bit just below the most significant bit (i.e., a significant bit next to the most significant bit). For example, in the case where the data converted from the signal S4 are "1010", the switch SW1 may be connected to the terminal of the voltage VREFN (a logic value "0" of a bit corresponding to weight $2^2$); the switch SW2 may be connected to the terminal of the voltage VREFP (a logic value "1" of a bit corresponding to weight $2^1$); and the switch SW3 may be connected to the terminal of the voltage VREFN (a logic value "0" of a bit corresponding to weight $2^0$). Operations of the switches SW1 to SW3 according to control of the logic circuit 2500 will be described with reference to FIGS. 5 to 9.

For example, the switches SW4 to SW7 in the second group may sequentially correspond to data converted from the signal Eq1 input to the noise coupling ADC 1531, from the most significant bit. For example, in the case where the data converted from the signal Eq1 are "1010", the switch SW4 may be connected to the terminal of the voltage VREFP (a logic value "1" of a bit corresponding to weight $2^3$), the switch SW5 may be connected to the terminal of the voltage VREFN (a logic value "0" of a bit corresponding to weight $2^2$), the switch SW6 may be connected to the terminal of the voltage VREFP (a logic value "1" of a bit corresponding to weight $2^1$), and the switch SW7 may be connected to the terminal of the voltage VREFN (a logic value "0" of a bit corresponding to weight $2^0$). Operations of the switches SW4 to SW7 according to control of the logic circuit 2500 will be described with reference to FIGS. 5 to 9.

For example, the switches SW3 to SW7 in the third group may sequentially correspond to data converted from the digital signal Ed2 input to the noise coupling DAC 1533, from the most significant bit. For example, in the case where the data converted from the signal Eq1 are "10100", the switch SW3 may be connected to the terminal of the voltage VREFP (a logic value "1" of a bit corresponding to weight $2^4$); the switch SW4 may be connected to the terminal of the voltage VREFN (a logic value "0" of a bit corresponding to weight $2^3$); the switch SW5 may be connected to the terminal of the voltage VREFP (a logic value "1" of a bit corresponding to weight $2^2$); the switch SW6 may be connected to the terminal of the voltage VREFN (a logic value "0" of a bit corresponding to weight $2^1$); and the switch SW7 may be connected to the terminal of the voltage VREFN (a logic value "0" of a bit corresponding to weight $2^0$). Operations of the switches SW3 to SW7 according to control of the logic circuit 2500 will be described with reference to FIGS. 5 to 9.

The main ADC block 2100 may include the capacitors C1 to C3 belonging to a first group. The noise coupling ADC block 2200 may include the capacitors C4 to C7 belonging to a second group. The noise coupling DAC block 2300 may include the capacitors C3 to C7 belonging to a third group. A ratio of capacitances of the capacitors C1 to C7 may be "64:32:16:8:4:2:1". The capacitances of the capacitors C1 to C7 may respectively correspond to individual bits of data generated by the SAR ADC 2000. The capacitors C1 to C7 may be connected between the switches SW1 to SW7 and a node ND.

The capacitor Cs may be connected between the node ND and a terminal of a voltage Vss. For example, the voltage Vss may be a ground voltage or a reference voltage. Alternatively, the voltage Vss may be the voltage VCM. For example, the voltage Vss may be supplied from a voltage generator or a voltage regulator positioned inside/outside the SAR ADC 2000.

The comparator 2400 may include an inverting terminal and a non-inverting terminal. The comparator 2400 may compare levels of voltages input to an inverting (or negative) terminal and a non-inverting (or positive) terminal. The comparator 2400 may operate based on an operating signal PH3 received from the logic circuit 2500. In an example of FIG. 4, the comparator 2400 may receive a voltage formed at the node ND through the non-inverting terminal. Also, the comparator 2400 may receive the voltage VCM through the inverting terminal. The comparator 2400 may compare a level of the voltage formed at the node ND and a level of the voltage VCM and may generate a comparison result. The comparator 2400 may output the comparison result to the logic circuit 2500 based on the received operating signal PH3. The comparator 2400 may output the comparison result to the logic circuit 2500 based on the clock CLK received from the logic circuit 2500.

The main ADC block 2100, the noise coupling ADC block 2200, and the noise coupling DAC block 2300 may share some components. In the example of FIG. 4, the main ADC block 2100 and the noise coupling DAC block 2300 may share the switch SW3 and the capacitor C3. In the example of FIG. 4, the noise coupling DAC block 2300 may include the noise coupling ADC block 2200. Components shared by at least two or more of the main ADC block 2100, the noise coupling ADC block 2200, and the noise coupling DAC block 2300 may perform different functions over time (refer to FIGS. 5 to 9).

As described with reference to FIG. 3, the implementation of the noise coupling ADC 1531 and the noise coupling DAC 1533 for converting an analog signal and a digital signal may be accompanied to implement the digital noise coupling filter 1532 operating in the digital domain. As well as the main ADC 1520, the noise coupling ADC 1531 and the noise coupling DAC 1533 may also be implemented by the one SAR ADC 2000 of FIG. 4. Accordingly, even though the ADC 1500 including the digital noise coupling filter 1532 is designed, the area occupied by the ADC 1500 may be small, and power consumption of the ADC 1500 may be low.

The logic circuit 2500 may receive the comparison result of the comparator 2400. The logic circuit 2.500 may control the switch block SW based on the received comparison result. The logic circuit 2500 may generate the operating signal PH1 for controlling an operation of the sampler 1300 of FIG. 1. For example, the logic circuit 2500 may generate the operating signal PH1 having a frequency of "fs". The logic circuit 2500 may output the operating signal PH1 to the sampler 1300.

The logic circuit 2500 may generate an operating signal PH2 for controlling an operation of the sampler 2600 of FIG. 4. The logic circuit 2500 may output the operating signal PH2 to the sampler 2600. The logic circuit 2500 may generate the operating signal PH3 for controlling an operation of the comparator 2400. The logic circuit 2500 may output the operating signal PH3 to the comparator 2400. The example operating signals PH1, PH2, and PH3 will be more fully described with reference to FIG. 10.

The logic circuit 2500 may generate the clock CLK for operations of the digital noise coupling filter 1532, the comparator 2400, and the logic circuit 2500 itself. The logic circuit 2500 may output the signal Dout indicating specific data based on the comparison result from the comparator 2400 and the clock CLK.

For example, in the case where the level of the voltage input to the non-inverting terminal is greater than the level of the voltage input to the inverting terminal, the logic circuit 2500 may generate data "1" based on the comparison result. For example, in the case where the level of the voltage input to the non-inverting terminal is not greater than the level of the voltage input to the inverting terminal, the logic circuit 2500 may generate data "0" based on the comparison result. The logic circuit 2500 may output the signal Dout indicating data, which are sequentially generated over time, based on the clock CLK.

The logic circuit 2500 may control the switches SW1 to SW7 based on the comparison result. For example, the logic circuit 2500 may connect one of the switches SW1 to SW7 with the terminal of the voltage VREFP based on data "1" generated based on the comparison result. For example, the logic circuit 2500 may connect one of the switches SW1 to SW7 with the terminal of the voltage VREFN based on data "0" generated based on the comparison result. Example operations of the logic circuit 2500 for controlling the switch block SW will be more fully described with reference to FIGS. 5 to 9.

The sampler 2600 may receive the signal S3 from the sampler 1300 and also receive the operating signal PH2 from the logic circuit 2500. The sampler 2600 may sample the signal S3 based on the operating signal PH2.

Below, an example operation of the SAR ADC 2000 which is performed during one cycle will be described with reference to FIGS. 5 to 9.

Figure 5:
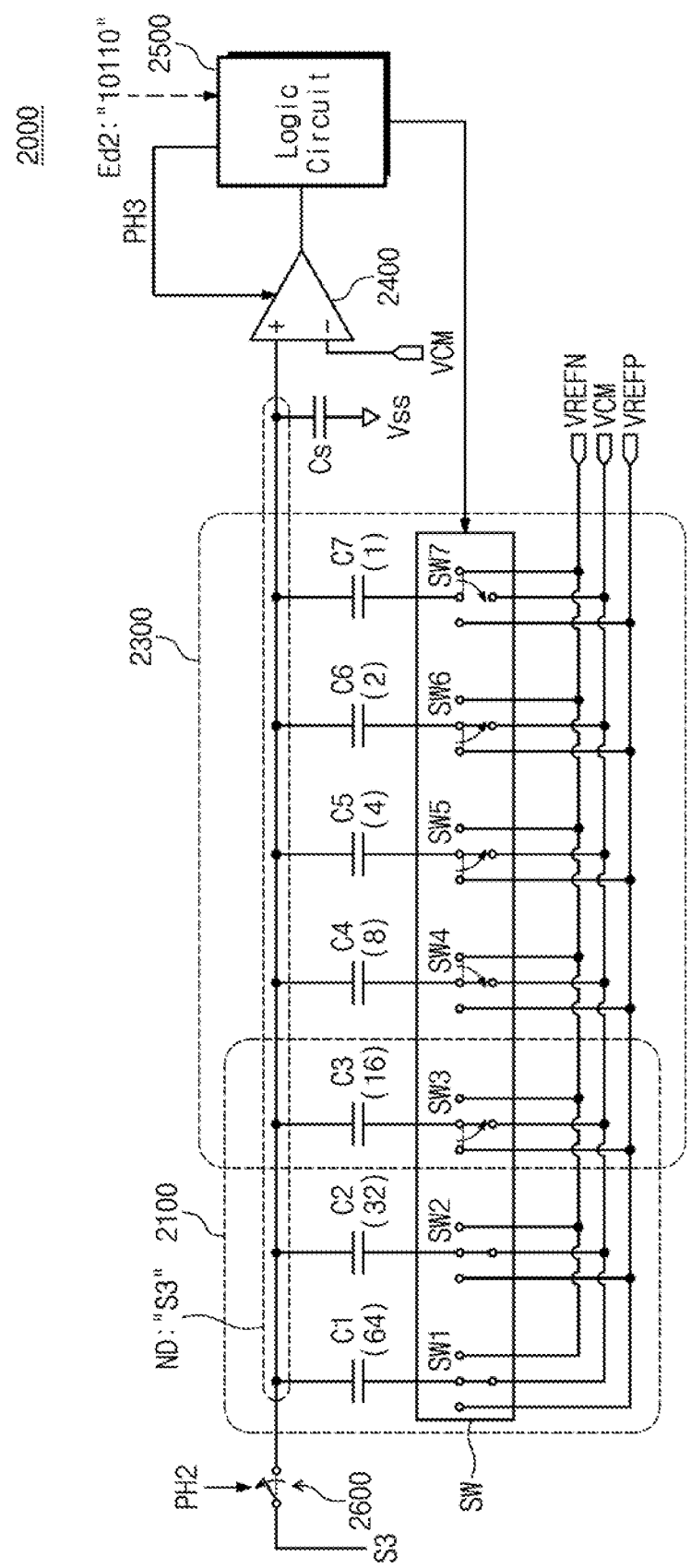
FIG. 5, FIG. 6, FIG. 7, FIG. 8 and FIG. 9 are each a respective circuit diagram illustrating example operations of a successive approximation register (SAR) ADC of FIG. 4.

FIG. 5 is a circuit diagram illustrating an example operation of a SAR ADC of FIG. 4. FIG. 5 describes a first phase of example operations of the SAR ADC 2000.

In an example of FIG. 5, before the signal S3 is transferred through the sampler 2600 (in an operation of the SAR ADC 2000 corresponding to a previous cycle), the logic circuit 2500 may receive the digital signal Ed2 fed back from the digital noise coupling filter 1532. For instance, the digital signal Ed2 fed back in the previous cycle may be generated based on a first level of the signal S3 sampled by the sampler 2600.

For example, data of the digital signal Ed2 fed back in the previous cycle may be "10110". In the previous cycle, under control of the logic circuit 2500, the switch SW3, the switch SW5, and the switch SW6 may have been connected with the terminal of the voltage VREFP, and the switch SW4 and the switch SW7 may have been connected with the terminal of the voltage VREFN. Also, in the previous cycle, the sampler 2600 may have sampled the signal S3 under control of the logic circuit 2500. Accordingly, a voltage having a level corresponding to a level of the signal S3 may be formed at the node ND. An operation which is similar to an operation of the SAR ADC 2000 in the previous cycle will be more fully described with reference to FIG. 9; thus, redundant description will be omitted.

Referring to FIG. 5, for an operation of a next cycle, the logic circuit 2500 may output a signal for controlling the switch block SW and the operating signal PH2. The sampler 2600 may stop sampling the signal S3 in response to the operating signal PH2 received from the logic circuit 2500. For instance, the sampler 2600 may block a transfer of the signal S3 to the node ND. Afterwards, the switches SW3 to SW7 may be connected to the terminal with the voltage VCM under control of the logic circuit 2500.

Figure 6:
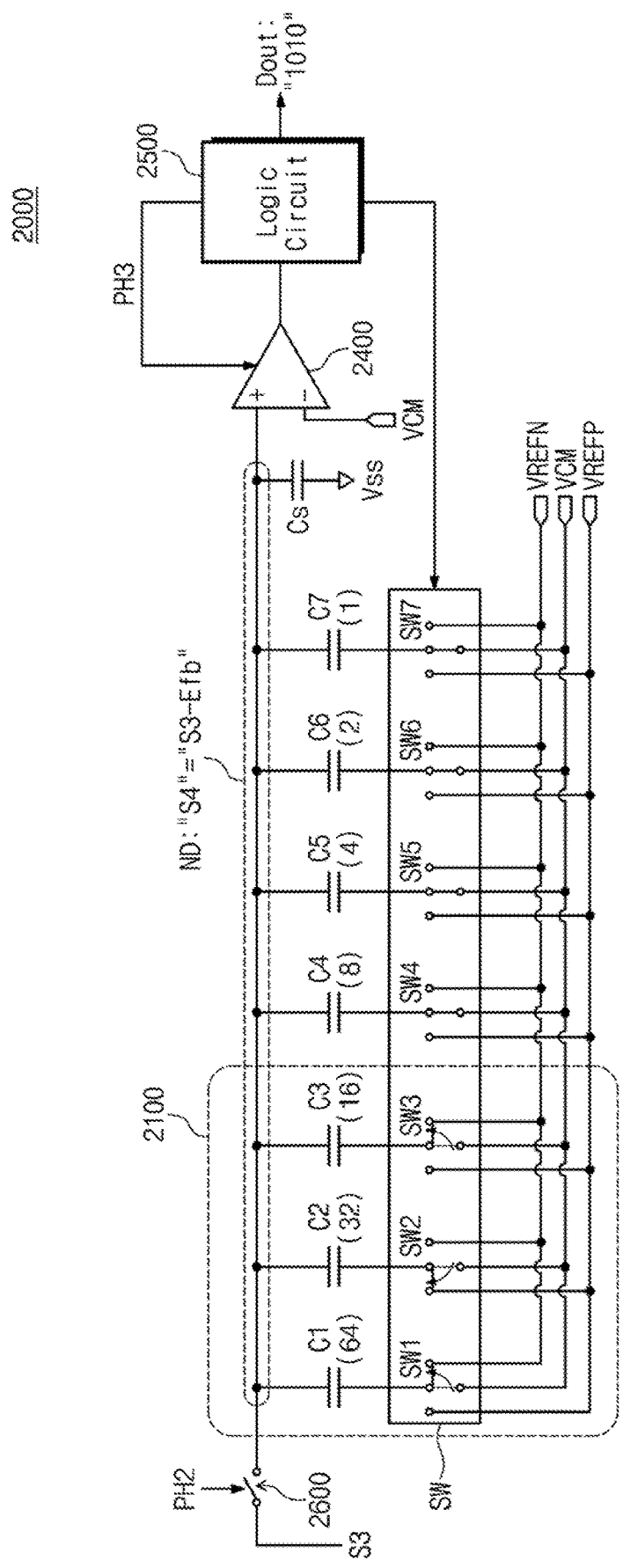

FIG. 6 is a circuit diagram illustrating an example operation of a SAR ADC of FIG. 4. FIG. 6 describes a second phase of example operations of the SAR ADC 2000. An operation of the second phase may correspond to the operation of the main ADC 1520 of FIG. 2.

As a transfer of the signal S3 is blocked by the sampler 2600, the signal S4 may be generated at the node ND. That is, as a level of a voltage formed at the node ND changes, a voltage having a level corresponding to a level of the signal S4 may be formed at the node ND. For example, the signal S4 having a level obtained by subtracting a level of the signal Efb from a level of the signal S3 may be generated. The level of the signal Efb may correspond to a value of data of the digital signal Ed2 of FIG. 5. Accordingly, the level of the signal S4 may be associated with a difference between the level of the signal S3 and the value of the data of the digital signal Ed2.

Before a voltage newly formed at the node ND by the signal S4 is distributed to the capacitors C1 to C7 and the capacitor Cs (that is, while a voltage, the level of which corresponds to the level of the signal S4, is maintained at the node ND), the comparator 2400 may compare the level of the voltage formed at the node ND and a level of the voltage VCM in response to the operating signal PH3 received from the logic circuit 2500 and may output a comparison result to the logic circuit 2500. In one example scenario of FIG. 5, the level of the voltage formed at the node ND may be greater than the level of the voltage VCM. The logic circuit 2500 may then generate data "1" based on the comparison result. Afterwards, as energy is stored in the capacitors C1 to C7 and the capacitor Cs, the voltage corresponding to the signal S4 may be distributed to the capacitors C1 to C7 and the capacitor Cs, and the voltage formed at the node ND may change.

In response to the operating signal PH3 received from the logic circuit 2500, the comparator 2400 may compare the level of the voltage formed at the node ND and the level of the voltage VCM and may again output a comparison result to the logic circuit 2500. In another example scenario of FIG. 5, the level of the voltage formed at the node ND may be smaller than the level of the voltage VCM. The logic circuit 2500 may then generate data "0" based on the comparison result. The logic circuit 2500 may control the switch SW1 based on the generated data "0". The switch SW1 may be connected to the terminal of the voltage VREFN corresponding to a logic value of "0" under control of the logic circuit 2500. Afterwards, as the energy stored in the capacitor C1 changes, the voltage formed at the node ND may change.

As in the above-described scheme, the logic circuit 2500 may sequentially generate data "1" and data "0". Accordingly, the logic circuit 2500 may generate the signal Dout indicating "1010". The logic circuit 2500 may output the signal Dout to any other component of an electronic device including the SAR ADC 2000, or to an external target device. As in the method in which the switch SW1 is controlled, the switch SW2 may be connected to the terminal of the voltage VREFP (may correspond to a logic value of "1"), and the switch SW3 may be connected to the terminal of the voltage VREFN (may correspond to a logic value of "0"). As a voltage supplied to the capacitors C1 to C3 changes, the energy stored in the capacitors C1 to C3 may change.

Figure 7:
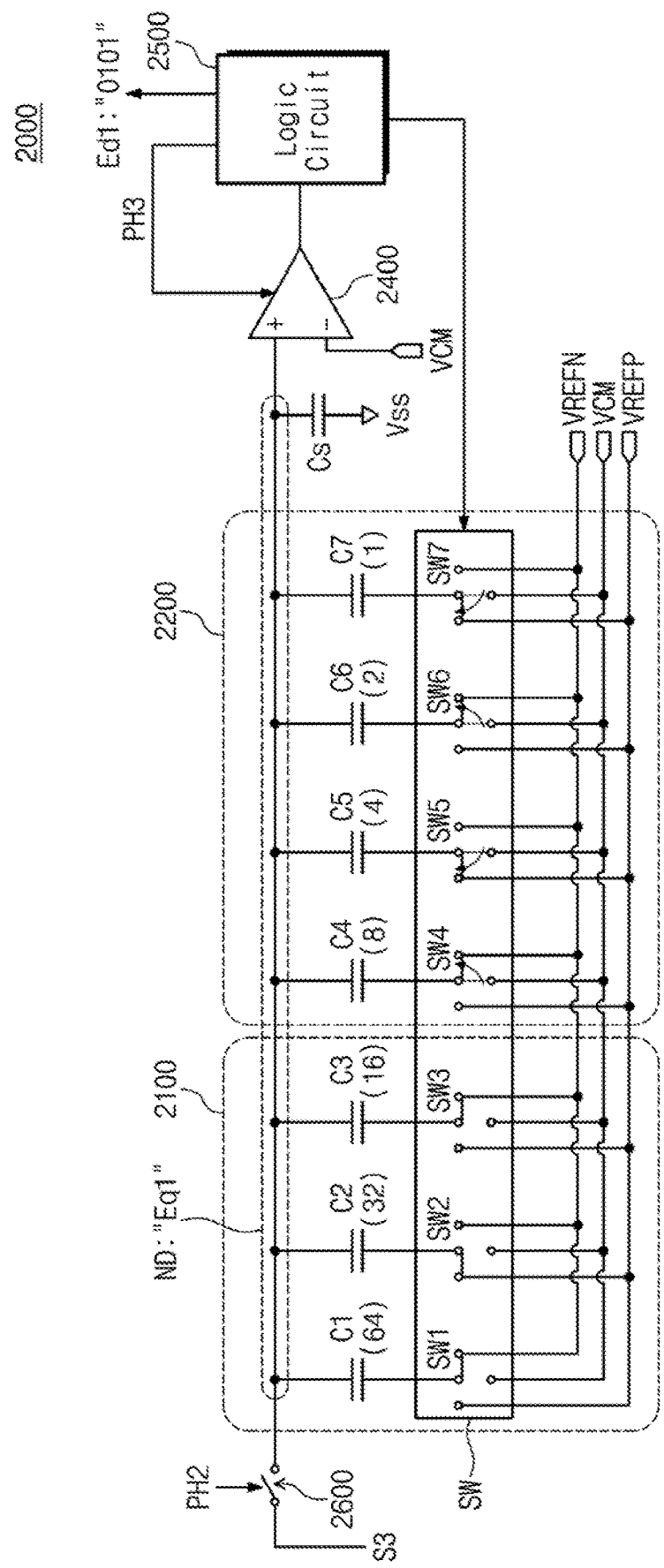

FIG. 7 is a circuit diagram illustrating an example operation of the SAR ADC of FIG. 4. FIG. 7 describes a third phase of example operations of the SAR ADC 2000. An operation of the third phase may correspond to the operation of the noise coupling ADC 1531 of FIG. 3 and the operation of the adder 1510 of FIG. 2.

The signal Eq1 may be generated as the energy stored in the capacitors C1 to C3 in the second phase of FIG. 6 changes. That is, as a level of a voltage formed at the node ND changes, a voltage, the level of which corresponds to a level of the signal Eq1, may be formed at the node ND. In further detail, a voltage of a level, which is obtained by subtracting a level of a voltage used to generate data of the signal Dout from the level of the voltage formed at the node ND by the signal S4, may be formed at the node ND (an operation corresponding to an operation of the adder 1510 of FIG. 2). The voltage formed at the node ND may correspond to a quantization error as a signal component, which fails to be converted to the signal Dout, from among signal components of the signal S4.

As in the operation described with reference to FIG. 5, the logic circuit 2500 may generate data "0101" corresponding to the quantization error. The logic circuit 2500 may output the digital signal Ed1 indicating data generated based on the clock CLK, to the digital noise coupling filter 1532 of FIG. 3.

Also, the logic circuit 2500 may control the switch block SW based on the data "0101" of the digital signal Ed1. For example, under control of the logic circuit 2500, the switches SW4 to SW7 in the second group may operate sequentially to correspond to the data "0101". The switch SW4 may be connected to the terminal having the voltage VREFN (corresponding to a logic value of "0"); the switch SW5 may be connected to the terminal having the voltage VREFP (corresponding to a logic value of "1"); the switch SW6 may be connected to the terminal having the voltage VREFN (corresponding to a logic value of "0"); and the switch SW7 may be connected to the terminal of the voltage VREFP (corresponding to a logic value of "1"). As a voltage supplied to the capacitors C4 to C7 changes, the energy stored in the capacitors C4 to C7 may change.

Figure 8:
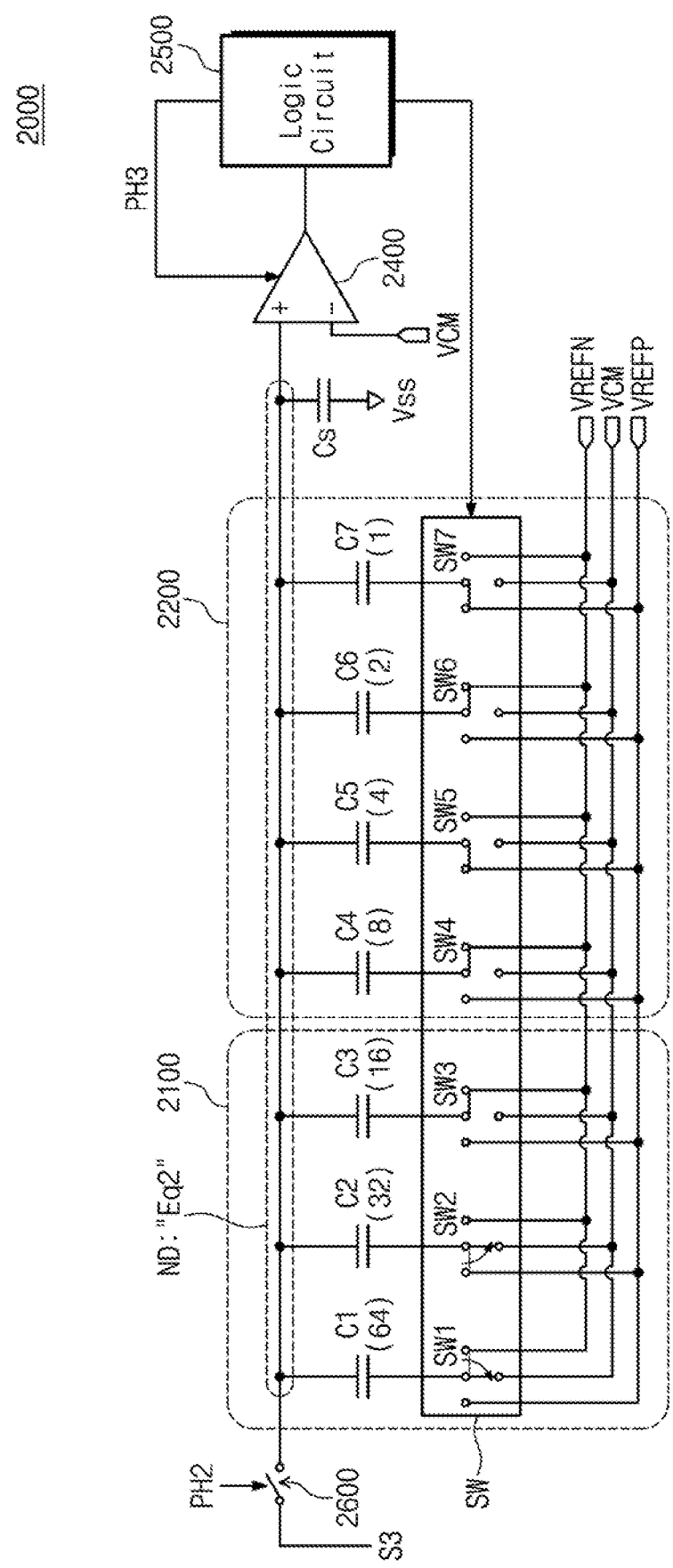

FIG. 8 is a circuit diagram illustrating an example operation of the SAR ADC of FIG. 4. FIG. 8 describes a fourth phase of example operations of the SAR ADC 2000.

A signal Eq2 may be generated as the energy stored in the capacitors C4 to C7 in the third phase of FIG. 7 changes. That is, as a level of a voltage formed at the node ND changes, a voltage having a level corresponding to a level of the signal Eq2 may be formed at the node ND. For instance, a voltage of a level, which is obtained by subtracting a level of a voltage used to generate data of the digital signal Ed2 from a level of a voltage formed at the node ND by the signal Eq1, may be formed at the node ND. The voltage formed at the node ND may correspond to signal components (a quantization error) that fail to be converted to the signal Ed1, from among signal components of the signal Eq1, corresponding to the quantization error occurring at the operation of the third phase of FIG. 7.

The logic circuit 2500 may control the switch block SW for an operation of a next phase. The switches SW1 and SW2 may be connected to the terminal having the voltage VCM under control of the logic circuit 2500. The switches SW1 and SW2 may correspond to a state in which data are not determined. As the switches SW1 and SW2 are connected to the terminal with the voltage VCM, energy stored in the capacitors C1 and C2 may change, and a level of a voltage formed at the node ND may change.

Figure 9:
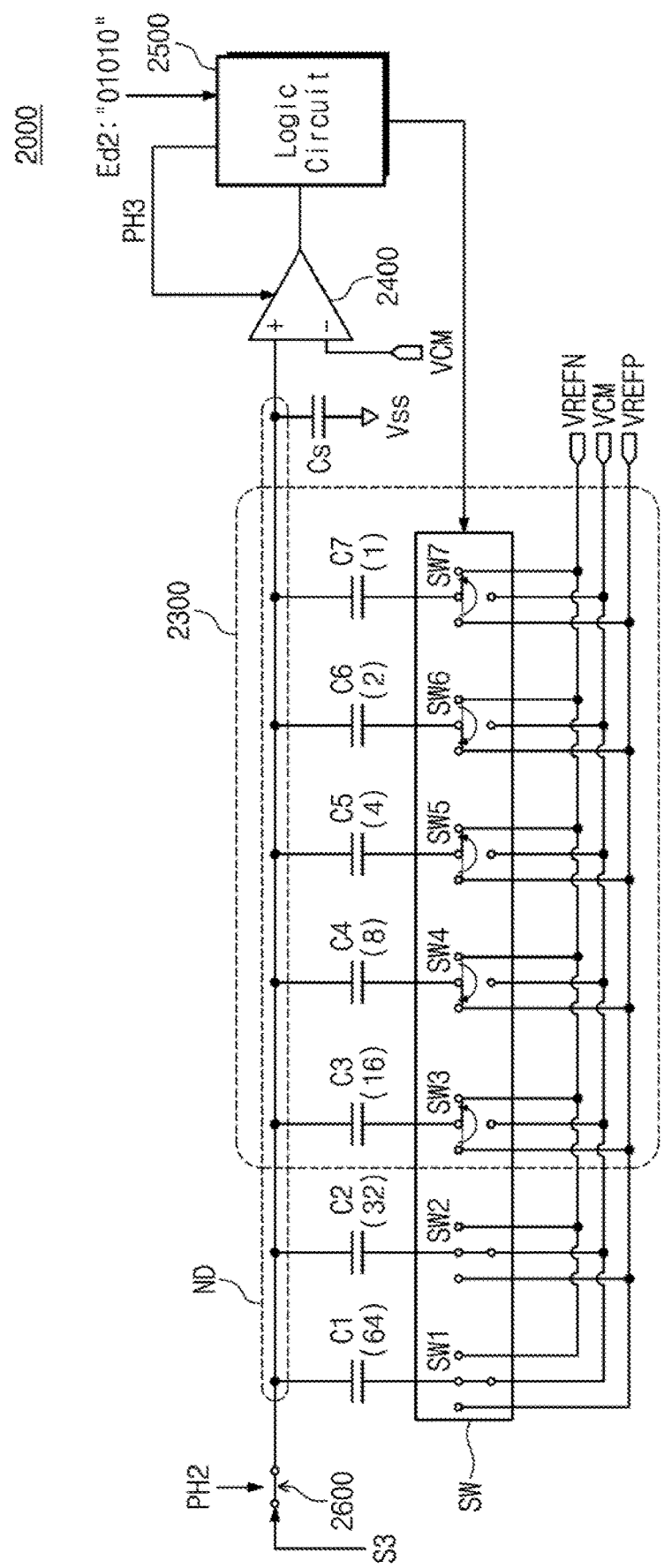

FIG. 9 is a circuit diagram illustrating an example operation of the SAR ADC of FIG. 4. FIG. 9 describes a fifth phase of example operations of the SAR ADC 2000. An operation of the fifth phase may correspond to the operation of the noise coupling DAC 1533 of FIG. 3.

The logic circuit 2500 may receive the digital signal Ed2 filtered by the digital noise coupling filter 1532. For example, the digital signal Ed2 may indicate data "00101". An example operation of the digital noise coupling filter 1532 will be more fully described with reference to FIG. 11.

The sampler 2600 may perform sampling on the signal S3 in response to the operating signal PH2. The sampler 2600 may transfer a second level of the sampled signal S3 to the node ND. Depending on the operation of the sampler 2600, a voltage, the level of which corresponds to a level of the signal S3, may be formed at the node ND.

The logic circuit 2500 may control the switch block SW based on data "01010" of the received digital signal Ed2. Under control of the logic circuit 2500, the switch SW3 may be connected to the terminal of the voltage VREFN (a logic value of "0"), the switch SW4 may be connected to the terminal of the voltage VREFP (a logic value of "1"), the switch SW5 may be connected to the terminal of the voltage VREFN (a logic value of "0"), the switch SW6 may be connected to the terminal of the voltage VREFP (a logic value of "1"), and the switch SW7 may be connected to the terminal of the voltage VREFN (a logic value of "0").

After the operation of the fifth phase of FIG. 9, operations of a next cycle including operations which are similar to the operations of the first to fourth phases of FIGS. 5 to 8 may be performed. In an operation of the SAR ADC 2000 of the next cycle, a third level of the sampled signal S3 may be transferred to the node ND. By the SAR ADC 2000, the signal S4 may be generated based on the third level of the signal S3 and the signal Efb. As in the process described with reference to FIGS. 5 to 8, the signal S4 may be converted to the signal Dout.

As the first to fifth phases of FIGS. 5 to 9 are performed, the SAR ADC 2000 may output the signal Dout to which the quantization error of the previous cycle is applied. Accordingly, by the SAR ADC 2000, the quantization error occurring in an operation where the signal S3 is converted to the signal Dout may decrease. That is, the SAR ADC 2000 may generate data closely resembling the signal S3.

An example implementation of the SAR ADC 2000 is described with reference to FIGS. 5 to 9. However, analog to digital converters of various alternative structures for implementing the main ADC 1520 of FIG. 2, the noise coupling ADC 1531 of FIG. 3, and the noise coupling DAC 1533 of FIG. 3 may be adopted in other embodiments.

Figure 10:
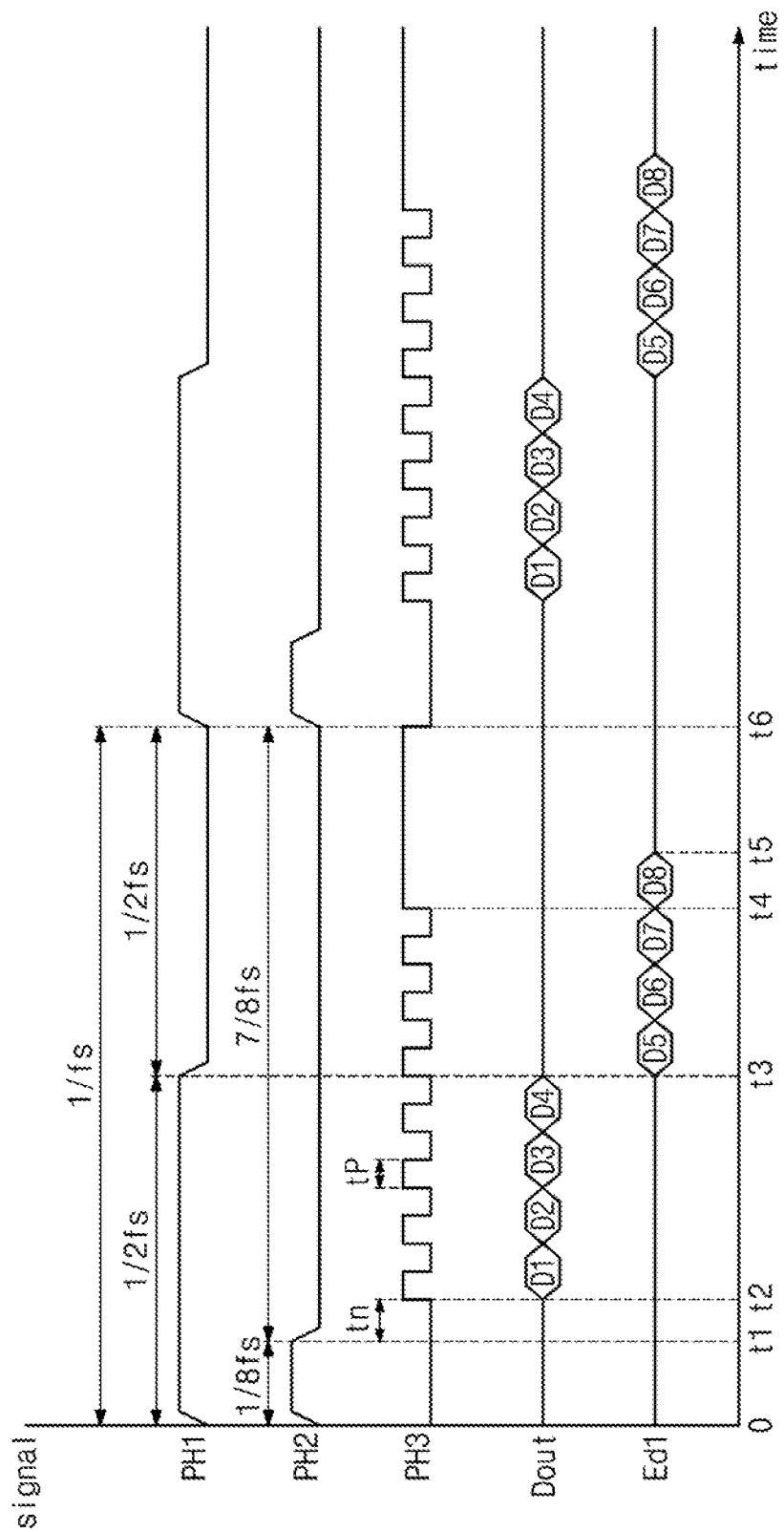
FIG. 10 is a timing diagram illustrating example operations of a SAR ADC described with reference to FIGS. 5 to 9.

FIG. 10 is a timing diagram illustrating example operations of a SAR ADC described with reference to FIGS. 5 to 9. In the example of FIG. 10, the horizontal axis represents a time and the vertical axis represents example signals generated in the SAR ADC 2000. The operating signal PH1 of FIG. 10 may be the operating signal PH1 of FIG. 1. The operating signal PH2 of FIG. 10 may be the operating signal PH2 of FIGS. 4 to 9. The operating signal PH3 of FIG. 10 may be the operating signal PH3 of FIGS. 4 to 9.

The operating signal PH1 may have an operating frequency of "fs". The operating signal PH1 may have a period equaling a time length "1/fs" from a time point "0" to a time point "t6". The operating signal PH1 may be logic "1" during a time of "½fs" corresponding to a time interval from the time point "1" to a time point "t3". Afterwards, the operating signal PH1 may be logic "0" during a time of "½fs" corresponding to a time interval from the time point "t3" to the time point "t5". The sampler 1300 may sample the signal S2 in response to logic "1" of the operating signal PH1. The sampler 1300 may sample the signal S2 to generate the signal S3.

The operating signal PH2 may have logic "1" during a time length shorter than "1/fs". In an example of FIG. 10, the operating signal PH2 may have logic "1" during a time of "⅛fs" corresponding to a time interval from the time point "0" to a time point "t1". The operating signal PH2 may have logic "0" during a time of "⅞fs" corresponding to a time interval from the time point "t1" to the time point "t6". The sampler 2600 may sample the signal S3 in response to logic "1" of the operating signal PH2.

A logic value of the operating signal PH3 may transition from logic "0" to logic "1" after a time length "tn" from the time point "t1" when a logic value of the operating signal PH2 changes. The operation of the first phase of FIG. 5 may be performed during the time "tn" corresponding to a time interval from the time point "t1" to the time point "t2". The operating signal PH3 may periodically have logic "1" and logic "0" in respective time intervals "tP" from the time point "t2" to a time point "t4", where the time interval "tP" is a period of one logic level. In the time interval from the time point "t2" to the time point "t4", the comparator 2400 may output a comparison result in response to logic "1" of the operating signal PH3. The operating signal PH3 may have logic "1" in a time interval from the time point "t4" to a time point "t6".

The operation of the second phase of FIG. 6 may be performed in the time interval from the time point "t2" to the time point "t3". Accordingly, the signal Dout may be output from the logic circuit 2500 as an output of the main ADC 1520 or an output of the modulator 1000. The signal Dout may sequentially indicate data bits "D1" to "D4". For example, the data bits "D1" to "D4" may be individual bits indicating 4-bit data.

The operation of the third phase of FIG. 7 may be performed in the time interval from the time point "t3" to the time point "t4". The digital signal Ed1 may be output from the logic circuit 2500 to the digital noise coupling filter 1532. The digital signal Ed1 may be associated with a quantization error occurring from the process in which the signal S3 is converted to the signal Dout. The digital signal Ed1 may sequentially indicate data bits "D5" to "D8". For example, the data bits "D5" to "D8" may be individual bits indicating 4-bit data.

The operation of the digital noise coupling filter 1532 of FIG. 3 may be performed in the time interval from the time point "t4" to the time point "t5". An example operation of the digital noise coupling filter 1532 will be more fully described with reference to FIG. 11. The operations of the first to fifth phases of FIGS. 5 to 9 may be performed periodically or repeatedly after the time point "t5".

Figure 11:
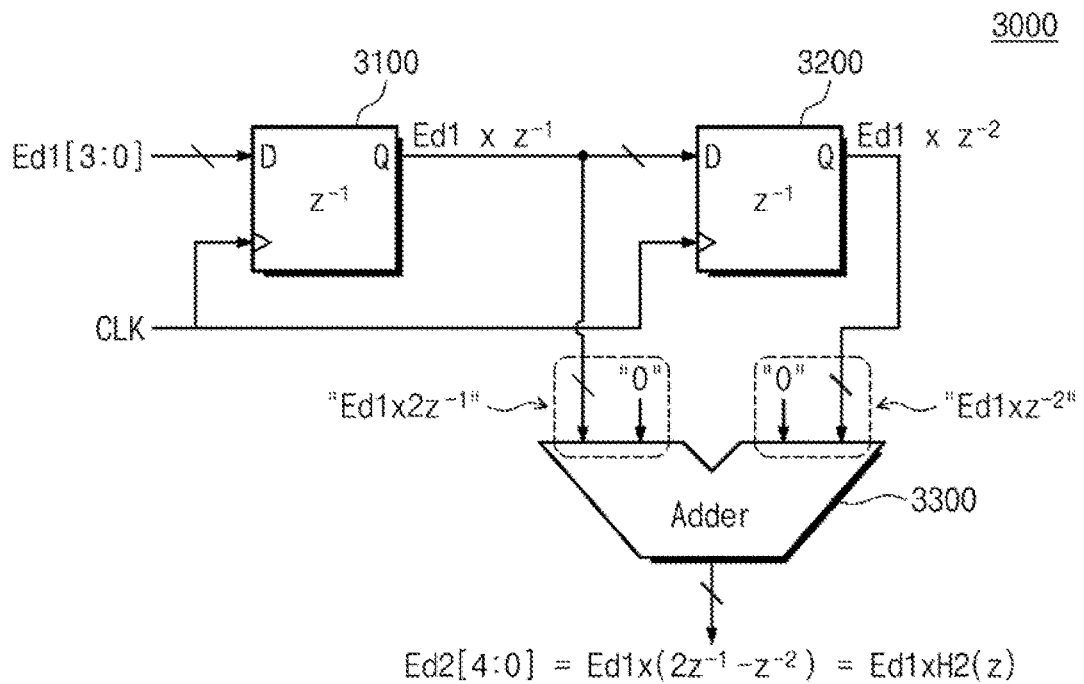
FIG. 11 is a block diagram illustrating an example configuration of a digital noise coupling filter of FIG. 3.

FIG. 11 is a block diagram illustrating an example digital noise coupling filter, 3000, which may be used for the digital noise coupling filter 1532 of FIG. 3.

The filter 3000 may have a characteristic of the transfer function H2(z) corresponding to Equation 2. As described with reference to Equation 2, the filter 3000 may have a characteristic of the second-order high pass filter.

Referring to FIG. 11, the filter 3000 may include a flip-flop 3100, a flip-flop 3200, and an adder 3300. Below, an example operation in which the filter 3000 processes 4-bit data of the digital signal Ed1 in a frequency domain will be described.

The flip-flop 3100 may receive the signal Ed1 as an input signal "D" from the noise coupling ADC 1531. The flip-flop 3100 may operate based on clock CLK received from the main ADC 1520. For example, the clock CLK may be received from the logic circuit 2500 of FIGS. 4 to 9. As the data of the signal Ed1 is stored by the flip-flop 3100, the signal Ed1 may be delayed. Accordingly, the flip-flop 3100 may output a delayed signal "Ed1×$z^{-1}$". As in the operation of the flip-flop 3100, the flip-flop 3200 may again delay the signal "Ed1×$z^{-1}$". The flip-flop 3200 may output a delayed signal "Ed1×$z^{-2}$".

The adder 3300 may receive the output "Ed1×$z^{-1}$" of the flip-flop 3100 as a first input signal and data "0". For example, the data "0" may be received from the logic circuit 2500. The data "0" may be input as the least significant bit of the first input signal. Data of the delayed signal "Ed1×$z^{-1}$" may be input as upper bits of the least significant bit. For example, in the case where the data of the delayed signal "Ed1×$z^{-1}$" are "1111", the first input signal of the adder 3300 may indicate "11110" (5-bit data). Accordingly, a value of data indicated by the first input signal may be two times a value of data indicated by the delayed signal "Ed1×$z^{-1}$". That is, the first input signal may be represented by "Ed1×$2z^{-1}$".

The adder 3300 may receive an output of the flip-flop 3200 as a second input signal and data "0". For example, the data "0" may be received from the logic circuit 2500. The data "0" may be input as the most significant bit of the second input signal. Data of the delayed signal "Ed1×$z^{-2}$" may be input as lower bits of the most significant bit. For example, in the case where the data of the delayed signal "Ed1×$z^{-2}$" are "1111", the second input signal of the adder 3300 may indicate "01111" (5-bit data).

The adder 3300 may add the data of the first input signal and the data of the second input signal. In an example of FIG. 11, the adder 3300 may output a signal indicating data of a value which is obtained by subtracting a value of the data of the second input signal from a value of the data of the first input signal. Accordingly, the adder 3300 may output a signal "Ed1×$(2z^{-1}-z^{-2})$" as the digital signal Ed2. Referring to Equation 2, since "$(2z^{-1}-z^{-2})$" is the transfer function "H2(z)" of the digital noise coupling filter 3000, the digital signal Ed2 may be represented by "Ed1×H2(z)". Since data of the first input signal and the second input signal input to the adder 3300 are 5-bit data, data of the signal Ed2 output from the adder 3300 may also be 5-bit data.

An example implementation of the digital noise coupling filter 1532 having a transfer function of Equation 2 has been described with reference to FIG. 11. However, various other types of filters having the transfer function of Equation 2 may be alternatively utilized. Further, higher or lower order filters than the second-order high pass filter described with reference to FIG. 11 may be substituted.

In the example of FIG. 11, the digital noise coupling filter 3000 may be implemented with the two flip-flops 3100 and 3200 and the one adder 3300. The flip-flops 3100 and 3200 and the adder 3300 may be embodied as electronic circuits for processing digital signals (hereafter, "digital electronic circuits"). Components for processing digital signals may include be smaller in number than those for processing an analog signal.

Since the digital noise coupling filter 1532 includes a small number of components including a small number of electronic circuits, the digital noise coupling filter 1532 may have low complexity. Accordingly, the digital noise coupling filter 1532 may occupy a smaller area, and consume less power, than a noise coupling filter operating in the analog domain.

Since electronic circuits for processing digital signals operate based on a level of a signal identified by a small number of states (e.g., two states respectively corresponding to two logic values), the electronic circuits for processing the digital signals may have less process-voltage-temperature (PVT) variation than an analog circuit configured to process continuous values. Accordingly, the digital noise coupling filter 1532 may have less PVT variation than a noise coupling filter operating in the analog domain. The modulator 1000 including the digital noise coupling filter 1532 may have a small PVT variation.

Figure 12:
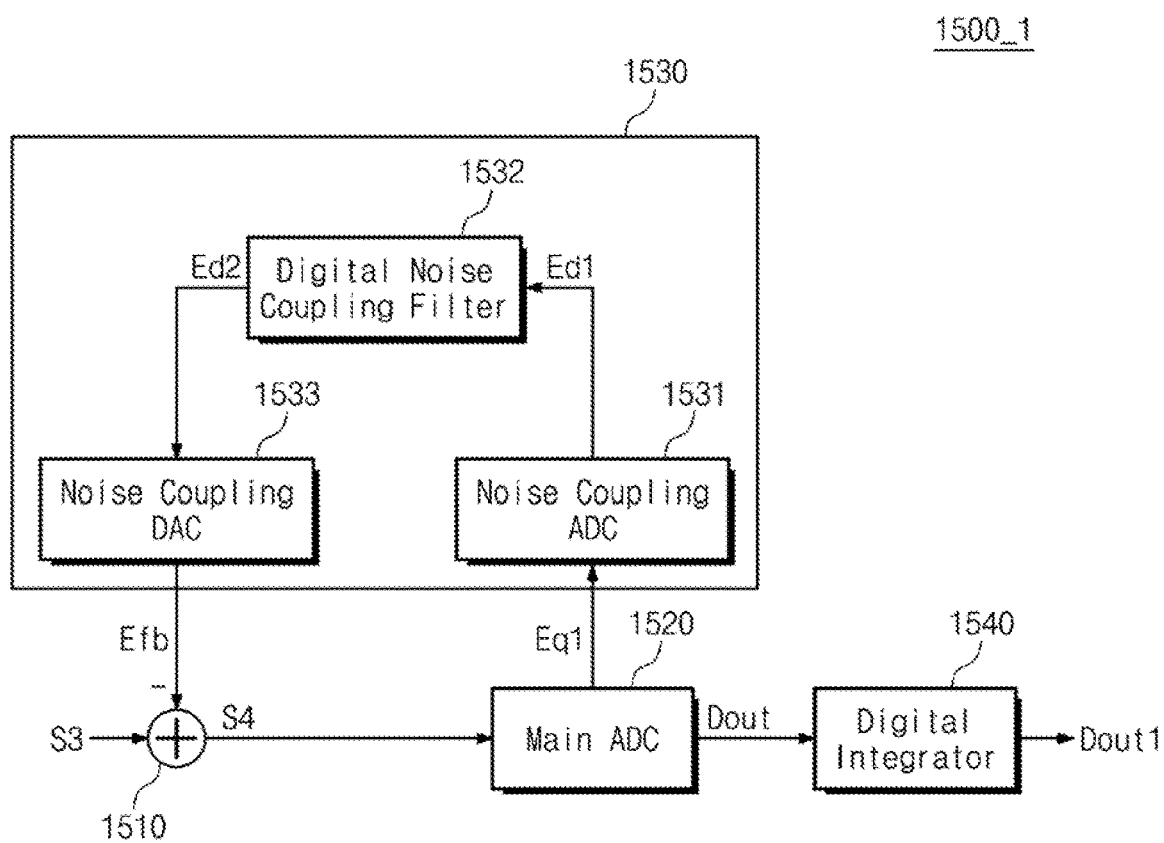
FIG. 12 is a block diagram illustrating an example configuration of an ADC of FIG. 2.

FIG. 12 is a block diagram illustrating an example configuration of an ADC of FIG. 2. Compared with the ADC 1500 of FIG. 2, an ADC 1500_1 of FIG. 12 may further include a digital integrator 1540. For example, the digital integrator 1540 may have a characteristic of a transfer function H4(z) corresponding to Equation 4:

$$H4(z)=z^{-1}/(1-z^{-1}).\qquad\text{[Equation 4]}$$

The digital integrator 1540 may output a signal Dout1 by accumulating a level of the signal Dout output from the main ADC 1520. Referring collectively to FIGS. 1 and 12, the ADC 1500_1 may output the signal Dout1 instead of the signal Dout. Also, the ADC 1500_1 may feed back the signal Dout1, instead of the signal Dout, towards the adder 1100.

Afterwards, the signal S3 may be generated based on the signal Dout1. In the frequency domain, the signal Dout1 may be expressed by the product of the signal Dout and the transfer function "H4(z)". A swing of the signal S3 generated based on the signal Dout1 may be smaller than a swing of the signal S3 generated based on the signal Dout. Since the signal S4 is generated based on the signal S3, a swing of the signal S4 may correspond to the swing of the signal S3.

The main ADC 1520 may operate properly based on the signal S4 having a swing within a reference range. In the case where the order of the digital noise coupling filter 1532 is high, a swing of the signal Efb fed back to the adder 1510 may become high. Accordingly, the swing of the signal S4 generated based on the signal Efb may also become high. As the swing of the signal S4 becomes high, the swing of the signal S4 may be out of the reference range. The main ADC 1520 which receives the signal S4 having a swing out of the reference range may operate improperly.

In the case where the swing of the signal S3 is decreased by the digital integrator 1540 connected to an output of the main ADC 1520, the swing of the signal S4 may also decrease. Accordingly, the main ADC 1520 may operate properly even based on the signal S4 which is generated from the signal Efb received from the high-order digital noise coupling filter 1532. This may mean that a designer may easily design the modulator 1000 including the high-order digital noise coupling filter 1532.

Figure 13:
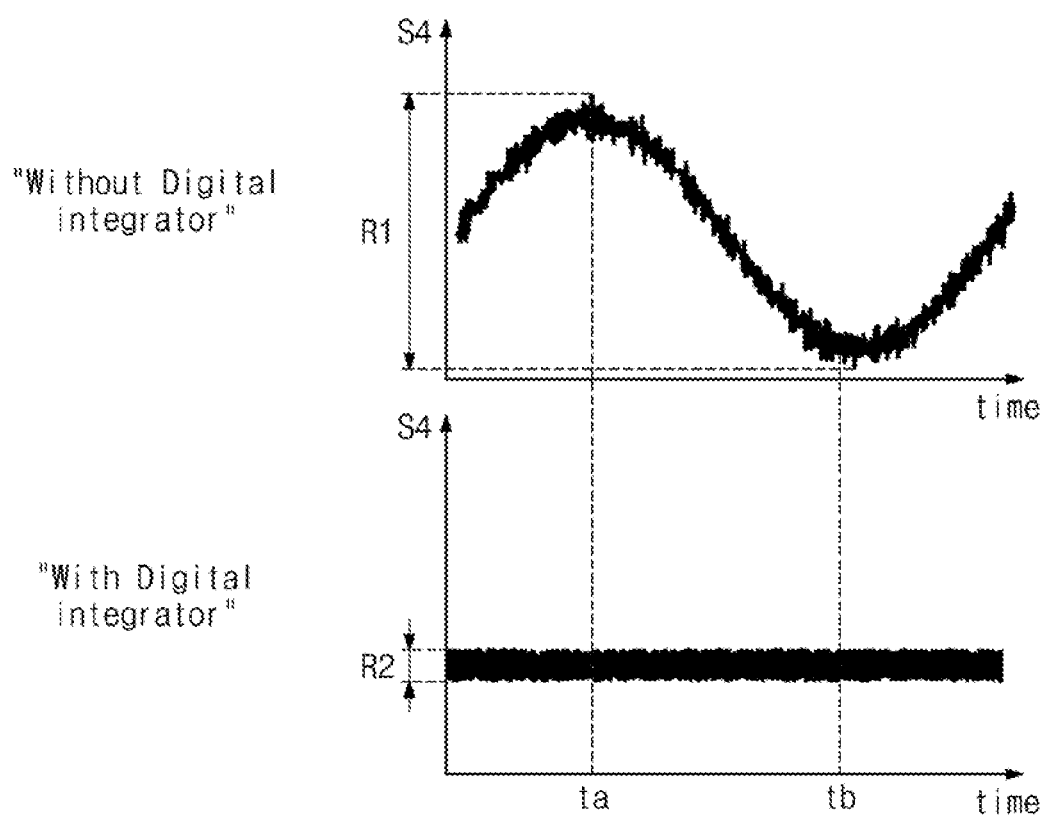
FIG. 13 is a graph illustrating example signals input to a main ADC of FIGS. 1 and 12.

FIG. 13 is a graph illustrating signals input to a main ADC of FIGS. 1 and 12. In the example of FIG. 13, the horizontal axis represents time and the vertical axis represents a level of the signal S4.

As shown in FIG. 13, between a time point "ta" and a time point "tb", a swing of the signal S4 of FIG. 1, that is, a swing of the signal S4 generated based on the signal Dout output from the ADC 1500 not including the digital integrator 1540 may correspond to "R1". Between the time point "ta" and the time point "tb", swing of the signal S4 of FIG. 12, that is, a swing of the signal S4 generated based on the signal Dout1 output from the ADC 1500_1 including the digital integrator 1540 may correspond to "R2". "R1" may be greater than "R2".

As described with reference to FIG. 12, in the case where the digital integrator 1540 is connected to the output of the main ADC 1520, the main ADC 1520 may operate based on the signal S4 having a smaller swing amplitude. Accordingly, in the case the modulator 1000 is designed to include the ADC 1500_1, the main ADC 1520, which operates normally based on a relatively small swing, may be included in the ADC 1500_1.

Figure 14:
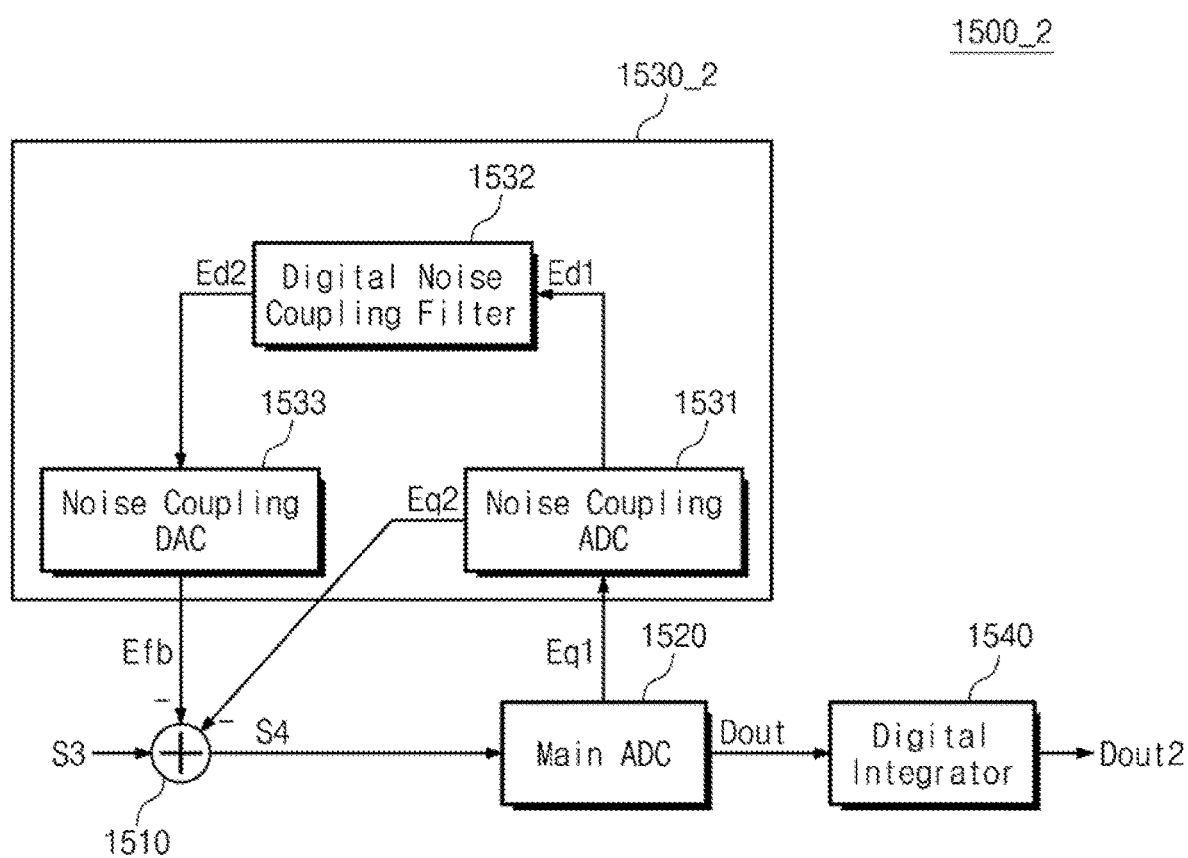
FIG. 14 is a block diagram illustrating an example configuration of an ADC of FIG. 2.

FIG. 14 is a block diagram illustrating an example configuration (ADC 1500_2) of an ADC of FIG. 2. In this example, the noise coupling ADC 1531 may output the signal Eq2 including a quantization error to the adder 1510. As described with reference to FIG. 8, the signal Eq2 may be associated with a quantization error occurring in an operation (e.g., the operation of the fourth phase of the SAR ADC 2000) of the noise coupling ADC 1531. Accordingly, the quantization error of the signal Eq2 may be associated with the signal Eq1 and the signal Ed2.

In the ADC 1500_2 is illustrated in FIG. 14, the signal Eq2 is output from the noise coupling ADC 1531 to the adder 1510, but this is for describing an embodiment of an operation for adding a level of the signal Eq2 and levels of the signals S3 and Efb. Alternative configurations for the ADC 1500_2 may be substituted for this purpose.

For example, the noise coupling ADC 1531 may output the signal Eq2 to the loop filter 1200 of FIG. 1. The loop filter 1200 may include an amplifier or the like to function as an integrator. The noise coupling ADC 1531 may output the signal Eq2 to an input of the amplifier. As the signal Eq2 is input to the amplifier, the amplifier may output the signal S3 experiencing the influence of the signal Eq2. For example, the amplifier may output the signal S3 having a level to which a level of the signal S2 is applied.

In an example of FIG. 14, the adder 1510 may output the signal S4 having a level which is obtained by subtracting the levels of the signals Efb and Eq2 from the level of the signal S3. As the level of the signal Eq2 is applied to the level of the signal S3, the magnitude of a quantization error associated with converting the signal S3 to a signal Dout2 may decrease.

Accordingly, the signal Dout2 may generate data indicating a level of an analog signal more precisely than the modulator 1000 including the ADC 1500_2 of FIG. 12 and the modulator 1000 including the ADC 1500 of FIG. 2.

Since the signal Eq2 is an analog signal, a feedback operation of the signal Eq2 may be performed in the analog domain. Accordingly, the noise coupling ADC 1531 may not include an additional component(s) for converting the signal Eq2 to a digital signal. Also, in the case where the signal Eq2 is fed back by the ADC 1500_2, an additional time necessary for converting the signal Eq2 to a digital signal is not taken.

Figure 15:
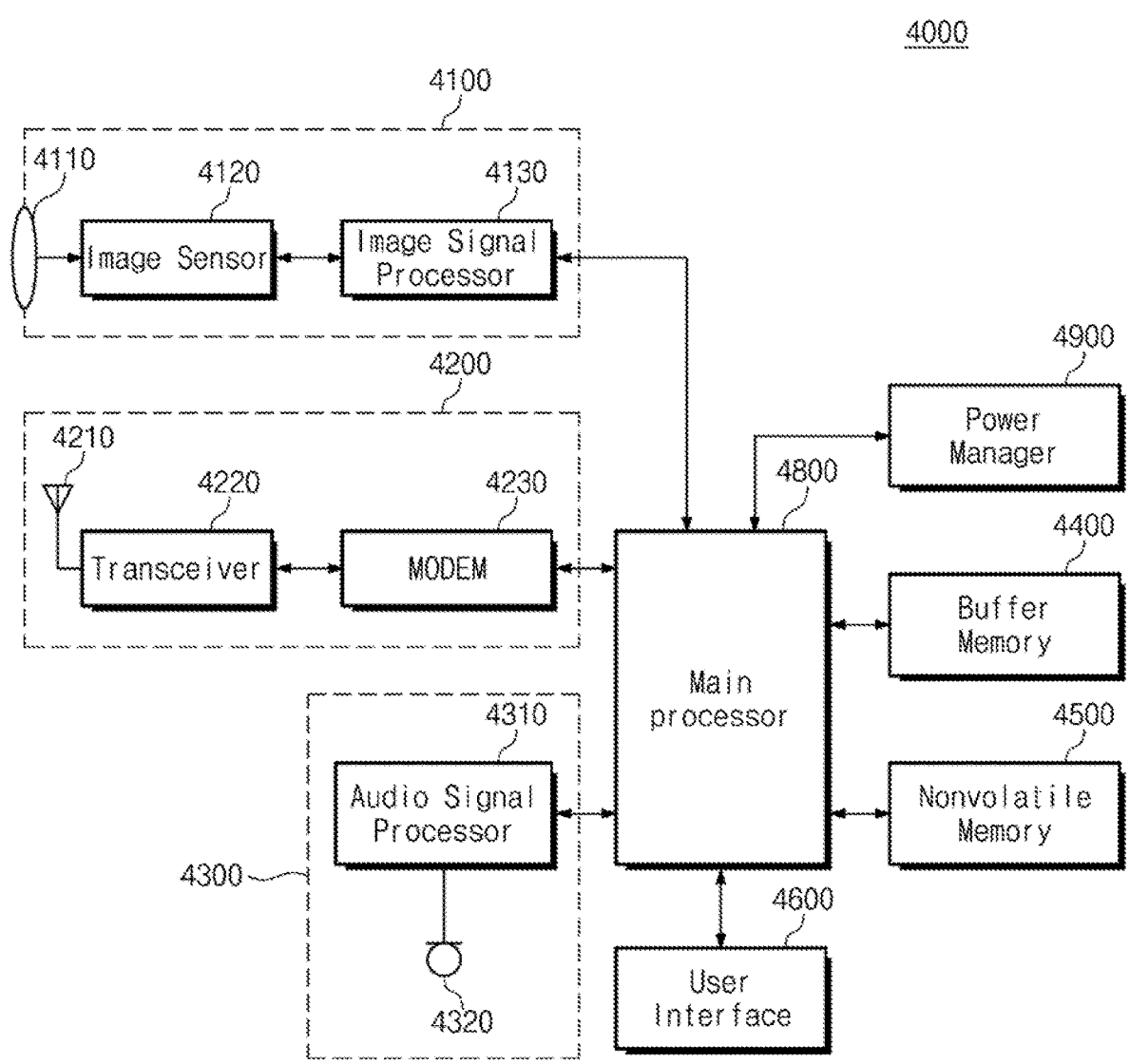
FIG. 15 is a block diagram illustrating an example configuration of an electronic device including a modulator of FIG. 1.

FIG. 15 is a block diagram illustrating an example configuration of an electronic device, 4000, including the modulator of FIG. 1. The electronic device 4000 may include an image processing block 4100, a communication block 4200, an audio processing block 4300, a buffer memory 4400, a nonvolatile memory 4500, a user interface 4600, a main processor 4800, and a power manager 4900. More or fewer components may be included in alternative examples.

The image processing block 4100 may include a lens 4110, an image sensor 4120, and an image signal processor 4130. The image processing block 4100 may receive light through the lens 4110. The image sensor 4120 may include pixels for photoelectric conversion of the light received through the lens 4110. The image sensor 4120 may include a modulator for converting analog signals generated by the photoelectric conversion to digital signals. For example, the image sensor 4120 may include the modulator 1000 of FIG. 1. The image signal processor 4130 may generate image information associated with an external subject based on the digital signals generated by the image sensor 4120.

The communication block 4200 may include an antenna 4210, a transceiver 4220, and a modulator/demodulator (MODEM) 4230. The communication block 4200 may exchange signals with an external device/system through the antenna 4210. The MODEM 4230 may include a modulator for converting an analog signal received through the antenna 4210 to a digital signal. For example, the transceiver 4220 may include the modulator 1000 of FIG. 1.

For example, the transceiver 4220 and the MODEM 4230 of the communication block 4200 may process signals exchanged with the external device/system in compliance with a wireless communication protocol such as long term evolution (LTE), worldwide interoperability for microwave access (WiMax), global system for mobile communication (GSM), code division multiple access (CDMA), Bluetooth, near field communication (NFC), wireless fidelity (Wi-Fi), or radio frequency identification (RFID).

The audio processing block 4300 may include an audio signal processor 4310 and a microphone 4320. The audio processing block 4300 may receive an analog audio signal through the microphone 4320. The microphone 4320 may receive an analog audio signal from the exterior of the electronic device 4000. The audio signal processor 4310 may include a modulator for converting the analog audio signal received through the microphone 4320 to a digital signal. For example, the audio signal processor 4310 may include the modulator 1000 of FIG. 1. The audio signal processor 4310 may generate audio information by using the digital signal converted by the modulator 1000.

The buffer memory 4400 may store data which are used in an operation of the electronic device 4000. For example, the buffer memory 4400 may temporarily store data processed or to be processed by the main processor 4800. For instance, the buffer memory 4400 may include a volatile memory, such as a static random access memory (SRAM), a dynamic RAM (DRAM), or a synchronous DRAM (SDRAM), and/or a nonvolatile memory, such as a flash memory, a phase-change RAM (PRAM), a magneto-resistive RAM (MRAM), a resistive RAM (ReRAM), or a ferro-electric RAM (FRAM).

The nonvolatile memory 4500 may store data regardless of power supply. For example, the nonvolatile memory 4500 may include at least one of various nonvolatile memories such as a flash memory, a PRAM, an MRAM, a ReRAM, and a FRAM. For example, the nonvolatile memory 4500 may include a removable memory such as a hard disk drive (HDD), a solid state drive (SSD), or a secure digital (SD) card, and/or an embedded memory such as an embedded multimedia card (eMMC).

The user interface 4600 may arbitrate communication between a user and the electronic device 4000. For example, the user may input commands to the electronic device 4000 through the user interface 4600. The user interface 4600 may include a sensor (e.g., a touch sensor and a motion sensor) for detecting an action of the user (e.g., a touch and a movement). The sensor may generate analog signals based on the detected action of the user. The user interface 4600 may include a modulator for converting the analog signals generated by the sensor. For example, the user interface 4600 may include the modulator 1000 of FIG. 1. The electronic device 4000 may provide information generated by the main processor 4800 to the user through the user interface 4600.

The main processor 4800 may control overall operations of the electronic device 4000. The main processor 4800 may control/manage operations of components of the electronic device 4000. The main processor 4800 may process various operations for the purpose of operating the electronic device 4000. For example, the main processor 4800 may process various operations based on digital signals converted by the modulator 1000 included in the image processing block 4100, the communication block 4200, the audio processing block 4300, the user interface 4600, etc. The main processor 4800 may be implemented with a general-purpose processor, a special-purpose processor, or an application processor.

The power manager 4900 may power the components of the electronic device 4000. For example, the power manager 4900 may appropriately convert electric power from a battery and/or an external power source and may transfer the converted electric power to the components of the electronic device 4000.

According to an embodiment of the inventive concept, a modulator including a high-order noise coupling filter may be implemented through a design of low complexity, and thus the modulator may occupy a small area within an electronic device. Also, power consumption of a modulator including a high-order noise coupling filter and a PVT variation of the noise coupling filter included in the modulator may be reduced.

While the inventive concept has been described with reference to example embodiments thereof, it will be apparent to those of ordinary skill in the art that various changes and modifications may be made thereto without departing from the spirit and scope of the inventive concept as set forth in the following claims.

What is claimed is:

1. An electronic circuit comprising:
an analog to digital converter (ADC) configured to generate a digital output signal based on a first analog signal and a second analog signal; and
a noise coupling filter configured to generate the second analog signal to be fed back for an input to the ADC, based on a quantization error signal associated with converting the first analog signal to the digital output signal,
wherein the noise coupling filter is further configured to perform A/D conversion of the quantization error signal to generate a digital error signal using a clock, perform noise shaping on the digital error signal derived from the quantization error signal and to generate the second analog signal from a result of the noise shaping, using the clock in a digital domain.

2. The electronic circuit of claim 1, wherein the ADC is further configured to:
convert a third analog signal, a level of which is obtained by subtracting a level of the second analog signal from a level of the first analog signal, to the digital output signal.

3. The electronic circuit of claim 2, wherein a magnitude of the quantization error signal is associated with a difference between a value corresponding to a level of the third analog signal and a value represented by the digital output signal.

4. The electronic circuit of claim 1, wherein the noise coupling filter is further configured to:
perform the noise shaping to attenuate signal components, which have frequencies below a reference frequency, from among signal components included in the digital error signal.

5. The electronic circuit of claim 1, wherein data expressed by the digital error signal is associated with a magnitude of the quantization error signal.

6. The electronic circuit of claim 1, wherein the digital error signal is a first digital error signal, and the noise coupling filter is further configured to:
generate a second digital error signal by performing the noise shaping on the first digital error signal using the clock; and
convert the second digital error signal to the second analog signal using the clock.

7. The electronic circuit of claim 6, wherein the quantization error signal is a first quantization error signal, and a magnitude of a second quantization error signal associated with converting the first quantization error signal to the first digital error signal is associated with a difference between a value corresponding to a magnitude of the first quantization error signal and a value represented by the first digital error signal.

8. The electronic circuit of claim 1, further comprising:
a digital integrator configured to accumulate the digital output signal so as to generate a second digital output signal.

9. The electronic circuit of claim 8, further comprising:
a digital to analog converter (DAC) configured to convert the second digital output signal to a fourth analog signal,
wherein the first analog signal is provided during a time that the fourth analog signal is fed back to the input of the ADC.

10. An electronic circuit comprising:
a noise coupling analog to digital converter (ADC) configured to generate a first digital error signal by A/D converting a quantization error signal associated with converting a first analog signal to a digital output signal based on a second analog signal;
a digital filter configured to generate a second digital error signal by attenuating signal components having frequencies below a reference frequency, from among signal components included in the first digital error signal; and
a noise coupling DAC configured to generate the second analog signal by D/A converting the second digital error signal.

11. The electronic circuit of claim 10, further comprising:
a main ADC configured to:
convert a third analog signal, a level of which is obtained by subtracting a level of the first analog signal from a level of the second analog signal, to the digital output signal.

12. The electronic circuit of claim 11, wherein the main ADC is further configured to generate a clock, and
wherein the digital filter is further configured to generate the second digital error signal based on the clock received from the main ADC.

13. The electronic circuit of claim 10, wherein the noise coupling ADC is further configured to generate a second quantization error signal associated with converting the quantization error signal to the first digital error signal.

14. An electronic circuit comprising:
an analog to digital converter (ADC) configured to:
generate a first digital output signal based on a first voltage formed at a reference node at a first time point;
generate a first digital error signal based on a second voltage formed at the reference node at a second time point after the first time point as the first digital output signal is generated; and
generate a second digital output signal based on a third voltage formed at the reference node at a third time point after the second time point as a second digital error signal is received; and
a digital filter configured to provide the ADC with the second digital error signal generated by attenuating signal components having frequencies below a reference frequency, from among signal components included in the first digital error signal.

15. The electronic circuit of claim 14, wherein the ADC includes a first group of capacitors connected to the reference node, and
wherein the capacitors of the first group of capacitors are configured to store energy corresponding to data represented by the first digital output signal based on the first voltage.

16. The electronic circuit of claim 15, wherein the ADC further includes a second group of capacitors connected to the reference node, and
wherein the capacitors of the second group of capacitors are configured to store energy corresponding to data represented by the first digital error signal based on the second voltage.

17. The electronic circuit of claim 16, wherein the ADC is implemented with a single successive approximation register (SAR) ADC including the first group of capacitors and the second group of capacitors.

18. The electronic circuit of claim 14, wherein the ADC includes:
a comparator configured to compare a level of the first voltage and a level of a common mode voltage so as to generate a comparison result; and
a logic circuit configured to generate the first digital output signal associated with the level of the first voltage based on the comparison result.

19. The electronic circuit of claim 14, further comprising:
a digital integrator configured to accumulate the first digital output signal,
wherein the first voltage is formed at the reference node based on the first digital output signal accumulated by the digital integrator.

20. The electronic circuit of claim 14, wherein the first voltage is formed based on a fourth voltage formed at the reference node at a fourth time point between the second time point and the third time point as the first digital error signal is generated.

21. The electronic circuit of claim 20, wherein the ADC includes:
a first group of switches configured to operate corresponding to data of the first digital output signal;
a second group of switches configured to operate corresponding to data of the first digital error signal; and
a third group of switches configured to operate corresponding to data of the second digital error signal.

22. The electronic circuit of claim 21, wherein the second voltage is formed at the reference node based on operations of the switches of the first group of switches, the fourth voltage is formed at the reference node based on operations of the switches of the second group of switches, and the third voltage is formed at the reference node based on operations of the switches of the third group of switches.

* * * * *